(12) United States Patent
Howder et al.

(10) Patent No.: US 12,200,929 B2
(45) Date of Patent: Jan. 14, 2025

(54) INTEGRATED CIRCUITRY COMPRISING A MEMORY ARRAY COMPRISING STRINGS OF MEMORY CELLS AND METHOD USED IN FORMING A MEMORY ARRAY COMPRISING STRINGS OF MEMORY CELLS

(71) Applicant: Micron Technology, Inc., Boise, ID (US)

(72) Inventors: Collin Howder, Boise, ID (US); M. Jared Barclay, Middleton, ID (US); Bhavesh Bhartia, Singapore (SG); Chet E. Carter, Boise, ID (US); John D. Hopkins, Meridian, ID (US); Andrew Li, Boise, ID (US); Haoyu Li, Boise, ID (US); Alyssa N. Scarbrough, Boise, ID (US); Grady S. Waldo, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 532 days.

(21) Appl. No.: 17/408,813

(22) Filed: Aug. 23, 2021

(65) Prior Publication Data

US 2023/0057852 A1 Feb. 23, 2023

(51) Int. Cl.
*H01L 27/11582* (2017.01)
*H10B 41/27* (2023.01)
*H10B 43/27* (2023.01)

(52) U.S. Cl.
CPC ............ *H10B 43/27* (2023.02); *H10B 41/27* (2023.02)

(58) Field of Classification Search
None
See application file for complete search history.

(56) References Cited

U.S. PATENT DOCUMENTS 10,636,812 B1 4/2020 Lai et al.
2015/0079748 A1 3/2015 Kim et al.
(Continued)

FOREIGN PATENT DOCUMENTS

TW 201921652 6/2019
TW 202030870 8/2020
(Continued)

OTHER PUBLICATIONS

WO PCT/US2022/037486 Search Rep., Nov. 11, 2022, Micron Technology, Inc.
(Continued)

*Primary Examiner* — Long Pham
(74) *Attorney, Agent, or Firm* — Wells St. John P.S.

(57) ABSTRACT

Integrated circuitry comprising a memory array comprises strings of memory cells comprising laterally-spaced memory blocks individually comprising a first vertical stack comprising alternating insulative tiers and conductive tiers above a conductor tier. Strings of memory cells comprise channel-material strings that extend through the insulative tiers and the conductive tiers. The channel-material strings directly electrically couple with conductor material of the conductor tier. The conductive tiers individually comprise a horizontally-elongated conductive line. A second vertical stack is aside the first vertical stack. The second vertical stack comprises an upper portion and a lower portion. The upper portion comprises vertically-alternating first insulating tiers and second insulating tiers that are of different insulative compositions relative one another. The lower portion comprises a horizontal line above the conductor tier that runs parallel with the laterally-spaced memory blocks in the first vertical stack. Other embodiments, including method, are disclosed.

25 Claims, 20 Drawing Sheets

(56) References Cited

U.S. PATENT DOCUMENTS

| | | |
|---|---|---|
| 2015/0255481 A1 | 9/2015 | Baenninger et al. |
| 2018/0261671 A1 | 9/2018 | Matsumoto et al. |
| 2019/0051661 A1 | 2/2019 | Carlson |
| 2020/0266203 A1 | 8/2020 | Bhushan et al. |
| 2020/0402890 A1 | 12/2020 | Chary et al. |
| 2021/0043644 A1 | 2/2021 | Hu et al. |
| 2021/0143054 A1 | 5/2021 | Kong et al. |
| 2021/0257386 A1 | 8/2021 | Wang et al. |
| 2022/0310641 A1* | 9/2022 | Hopkins ............... H10B 43/10 |
| 2023/0247828 A1* | 8/2023 | Hopkins ............... H10B 41/35 |
| | | 257/318 |
| 2023/0345723 A1* | 10/2023 | Wang .................... H10B 41/27 |
| 2024/0107747 A1* | 3/2024 | Rigano ............... H01L 29/7827 |

FOREIGN PATENT DOCUMENTS

| | | |
|---|---|---|
| TW | 202040792 | 11/2020 |
| TW | 202121605 | 6/2021 |
| TW | 202121661 | 6/2021 |
| WO | PCT/US2022/037486 | 2/2024 |

OTHER PUBLICATIONS

WO PCT/US2022/037486 Writt. Opin., Nov. 11, 2022, Micron Technology, Inc.

\* cited by examiner

INTEGRATED CIRCUITRY COMPRISING A MEMORY ARRAY COMPRISING STRINGS OF MEMORY CELLS AND METHOD USED IN FORMING A MEMORY ARRAY COMPRISING STRINGS OF MEMORY CELLS

TECHNICAL FIELD

Embodiments disclosed herein pertain to integrated circuitry comprising a memory array comprising strings of memory cells and to methods used in forming a memory array comprising strings of memory cells.

BACKGROUND

Memory is one type of integrated circuitry and is used in computer systems for storing data. Memory may be fabricated in one or more arrays of individual memory cells. Memory cells may be written to, or read from, using digitlines (which may also be referred to as bitlines, data lines, or sense lines) and access lines (which may also be referred to as wordlines). The sense lines may conductively interconnect memory cells along columns of the array, and the access lines may conductively interconnect memory cells along rows of the array. Each memory cell may be uniquely addressed through the combination of a sense line and an access line.

Memory cells may be volatile, semi-volatile, or non-volatile. Non-volatile memory cells can store data for extended periods of time in the absence of power. Non-volatile memory is conventionally specified to be memory having a retention time of at least about 10 years. Volatile memory dissipates and is therefore refreshed/rewritten to maintain data storage. Volatile memory may have a retention time of milliseconds or less. Regardless, memory cells are configured to retain or store memory in at least two different selectable states. In a binary system, the states are considered as either a "0" or a "1". In other systems, at least some individual memory cells may be configured to store more than two levels or states of information.

A field effect transistor is one type of electronic component that may be used in a memory cell. These transistors comprise a pair of conductive source/drain regions having a semiconductive channel region there-between. A conductive gate is adjacent the channel region and separated there-from by a thin gate insulator. Application of a suitable voltage to the gate allows current to flow from one of the source/drain regions to the other through the channel region. When the voltage is removed from the gate, current is largely prevented from flowing through the channel region. Field effect transistors may also include additional structure, for example a reversibly programmable charge-storage region as part of the gate construction between the gate insulator and the conductive gate.

Flash memory is one type of memory and has numerous uses in modern computers and devices. For instance, modern personal computers may have BIOS stored on a flash memory chip. As another example, it is becoming increasingly common for computers and other devices to utilize flash memory in solid state drives to replace conventional hard drives. As yet another example, flash memory is popular in wireless electronic devices because it enables manufacturers to support new communication protocols as they become standardized, and to provide the ability to remotely upgrade the devices for enhanced features.

NAND may be a basic architecture of integrated flash memory. A NAND cell unit comprises at least one selecting device coupled in series to a serial combination of memory cells (with the serial combination commonly being referred to as a NAND string). NAND architecture may be configured in a three-dimensional arrangement comprising vertically-stacked memory cells individually comprising a reversibly programmable vertical transistor. Control or other circuitry may be formed below the vertically-stacked memory cells. Other volatile or non-volatile memory array architectures may also comprise vertically-stacked memory cells that individually comprise a transistor.

Memory arrays may be arranged in memory pages, memory blocks and partial blocks (e.g., sub-blocks), and memory planes, for example as shown and described in any of U.S. Patent Application Publication Nos. 2015/0228651, 2016/0267984, and 2017/0140833. The memory blocks may at least in part define longitudinal outlines of individual wordlines in individual wordline tiers of vertically-stacked memory cells. Connections to these wordlines may occur in a so-called "stair-step structure" at an end or edge of an array of the vertically-stacked memory cells. The stair-step structure includes individual "stairs" (alternately termed "steps" or "stair-steps") that define contact regions of the individual wordlines upon which elevationally-extending conductive vias contact to provide electrical access to the wordlines.

DETAILED DESCRIPTION OF EXAMPLE EMBODIMENTS

Figure 1:
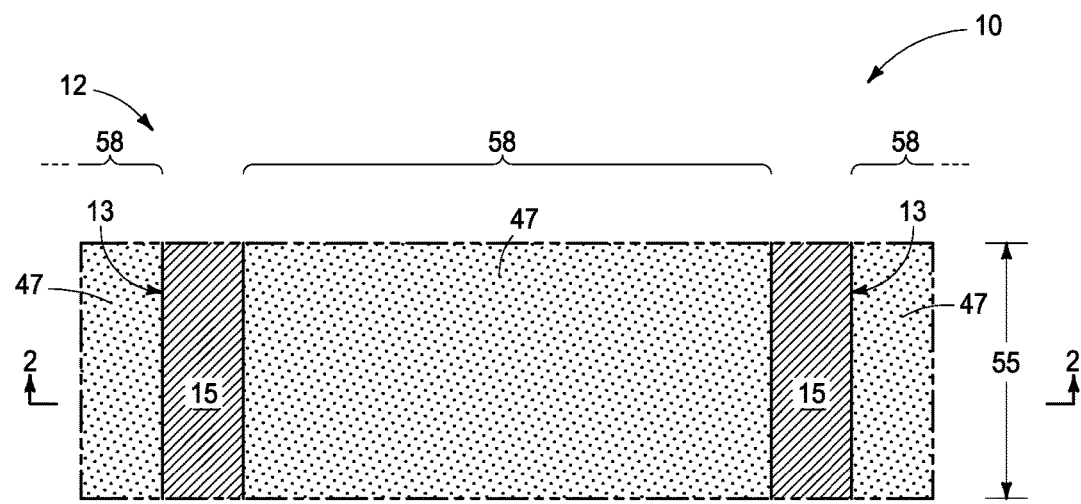
FIGS. 1-4 are diagrammatic cross-sectional views of portions of a construction that will comprise an array of elevationally-extending strings of memory cells in accordance with an embodiment of the invention.

Embodiments of the invention encompass methods used in forming a memory array, for example an array of NAND or other memory cells that may have at least some peripheral control circuitry under the array (e.g., CMOS-under-array). Embodiments of the invention encompass so-called "gate-last" or "replacement-gate" processing, so-called "gate-first" processing, and other processing whether existing or future-developed independent of when transistor gates are formed. Embodiments of the invention also encompass integrated circuitry comprising a memory array comprising strings of memory cells (e.g., NAND architecture) independent of method of manufacture. First example method embodiments are described with reference to FIGS. 1-42.

FIGS. 1-4 show an example construction 10 having an array 12 in which elevationally-extending strings of transistors and/or memory cells will be formed. Such includes a base substrate 11 having any one or more of conductive/conductor/conducting, semiconductive/semiconductor/semiconducting, or insulative/insulator/insulating (i.e., electrically herein) materials. Various materials have been formed elevationally over base substrate 11. Materials may be aside, elevationally inward, or elevationally outward of the FIGS. 1-4—depicted materials. For example, other partially or wholly fabricated components of integrated circuitry may be provided somewhere above, about, or within base substrate 11. Control and/or other peripheral circuitry for operating components within an array (e.g., array 12) of elevationally-extending strings of memory cells may also be fabricated and may or may not be wholly or partially within an array or sub-array. Further, multiple sub-arrays may also be fabricated and operated independently, in tandem, or otherwise relative one another. In this document, a "sub-array" may also be considered as an array.

A conductor tier 16 comprising conductor material 17 has been formed above substrate 11. Conductor material 17 as shown comprises upper conductor material 43 directly above and directly electrically coupled to (e.g., directly against) lower conductor material 44 of different composition from upper conductor material 43. In one embodiment, upper conductor material 43 comprises conductively-doped semiconductive material (e.g., n-type-doped or p-type-doped polysilicon). In one embodiment, lower conductor material 44 comprises metal material (e.g., a metal silicide such as $WSi_x$). Conductor tier 16 may comprise part of control circuitry (e.g., peripheral-under-array circuitry and/or a common source line or plate) used to control read and write access to the transistors and/or memory cells that will be formed within array 12.

A lower portion 18L of a stack 18* has been formed above substrate 11 and conductor tier 16 (an * being used as a suffix to be inclusive of all such same-numerically-designated components that may or may not have other suffixes). Stack 18* will comprise vertically-alternating conductive tiers 22* and insulative tiers 20*, with material of tiers 22* being of different composition from material of tiers 20*. Stack 18* comprises laterally-spaced memory-block regions 58 that will comprise laterally-spaced memory blocks 58 in a finished circuitry construction. In this document, unless otherwise indicated, "block" is generic to include "sub-block". Memory-block regions 58 and resultant memory blocks 58 (not yet shown) may be considered as being longitudinally elongated and oriented, for example along a direction 55. Memory-block regions 58 may not be discernable at this point of processing.

Conductive tiers 22* (alternately referred to as first tiers) may not comprise conducting material and insulative tiers 20* (alternately referred to as second tiers) may not comprise insulative material or be insulative at this point in processing in conjunction with the hereby initially-described example method embodiment which is "gate-last" or "replacement-gate". In one embodiment, lower portion 18L comprises a lowest tier 20z of second tiers 20* directly above (e.g., directly against) conductor material 17. Example lowest second tier 20z is insulative and may be sacrificial (e.g., comprising material 62, for example silicon dioxide and/or silicon nitride). A next-lowest second tier 20x of second tiers 20* is directly above lowest second tier 20z (e.g., comprising material 63, for example silicon dioxide and/or silicon nitride). A lowest tier 22z of first tiers 22* comprising sacrificial material 77 (e.g., polysilicon or silicon nitride) is vertically between lowest second tier 20z and next-lowest second tier 20x. In one embodiment, lower portion 18L comprises a conducting-material tier 21 comprising conducting material 47 (e.g., conductively-doped polysilicon) that is directly above next-lowest second tier 20x. In one embodiment, lower portion 18L comprises an uppermost tier, for example a next-next lowest second tier 20w (e.g., comprising material 24, for example silicon dioxide). Tiers 20w and 21 may be of the same or of different thickness(es) relative one another. Additional tiers may be present. For example, one or more additional tiers may be above tier 20w (tier 20w thereby not being the uppermost tier in portion 18L, and not shown), between tier 20w and tier 21 (not shown), and/or below tier 22z (other than 20z not being shown). In one embodiment, lower portion 18L at least as initially formed comprises multiple first/conductive tiers (e.g., 22z and 21) tiers and multiple second/insulative tiers (e.g., 20z, 20x, 20w).

Lower portion 18L comprises horizontally-elongated lines 13 that are individually between immediately-laterally-adjacent memory-block regions 58. Lines 13 may taper laterally-inward or laterally-outward moving deeper into lower stack portion 18L (not shown) Lines 13 may be considered individually as comprising sidewalls 51 and laterally-opposing uppermost corner regions 75. Lines 13 individually comprise sacrificial material 15, for example of different composition from those of materials 24, 47, 63, and 77. In one embodiment, sacrificial material 15 is conductive (e.g., comprising one or both of conductively-doped semiconductor material or metal material), in one embodiment is insulative, and in one embodiment is semiconductive. By way of examples only, examples include elemental tungsten over a thin layer of TiN, aluminum dioxide, hafnium oxide, other metal oxides, and polysilicon. In some embodiments, the material that is aside lines 13 in lower portion 18L may be considered as lower-portion material (e.g., 62/77/63/47/24). In one such embodiment, lines 13 and lower-portion material 62/77/63/47/24 comprise respective uppermost surfaces 31 and 33 that are individually planar and collectively co-planar.

Figure 2:
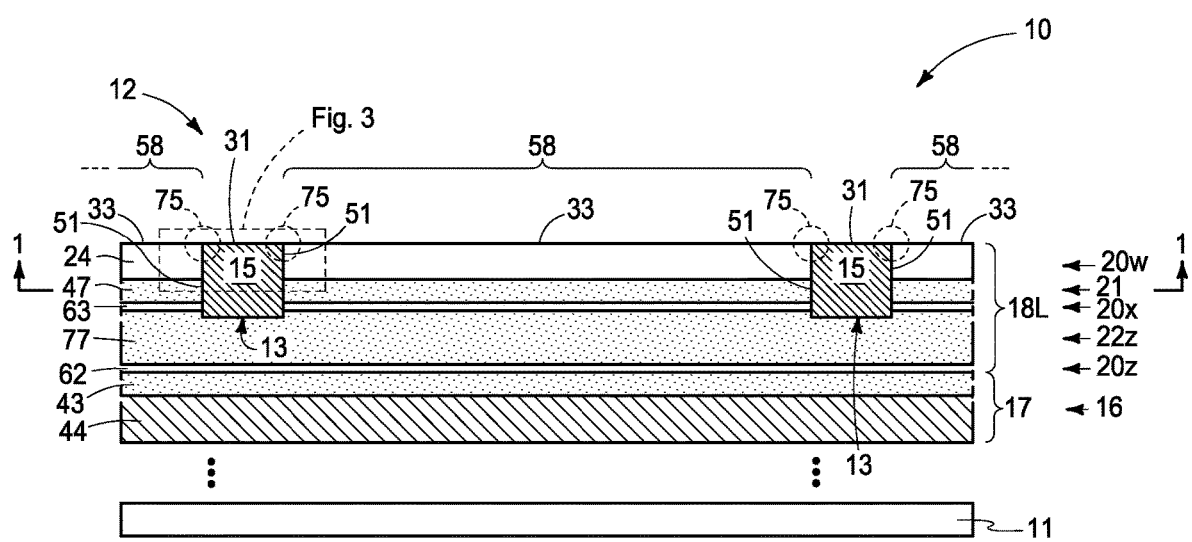
Figure 3:
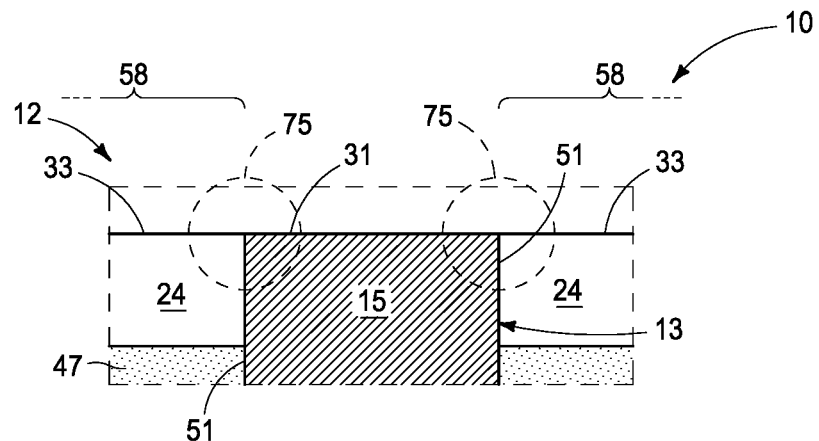
Figure 4:
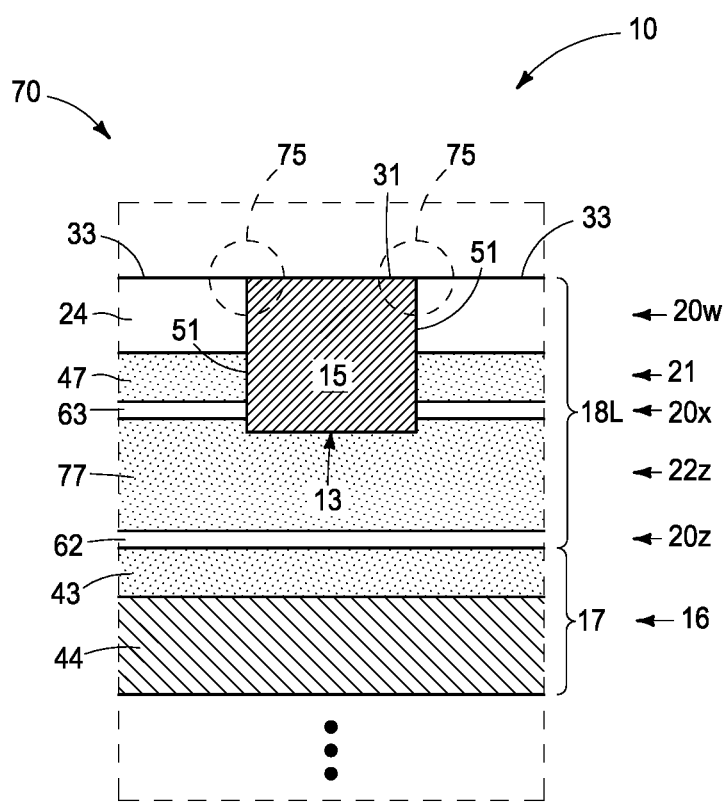

In some embodiments, construction 10 may be considered as comprising a first region (e.g., as shown by FIGS. 1-3) and a second region 70 aside the first region (e.g., as shown in FIG. 4). Second region 70 may be laterally-contacting the first region (not shown) or may be laterally-spaced from the first region (e.g., closely laterally there-adjacent but not touching, or laterally-far there-from and not touching). Second region 70 may be within one or more of the memory-block regions (not shown). In some embodiments, construction 10 may be considered as comprising a first vertical stack (e.g., stack 18* in FIG. 2) and a second vertical stack (e.g., stack 18* in second region 70). Lower portion 18L in second vertical stack 18* in second region 70 comprises a horizontal line 13 above conductor tier 16 that runs parallel with laterally-spaced memory blocks 58 (e.g., into and out of the plane of the page upon which FIG. 4 lies) in first vertical stack 18* in FIG. 2, e.g., like FIG. 1. In one embodiment, processing as described above has occurred with respect to line 13 in second region 70.

Figure 5:
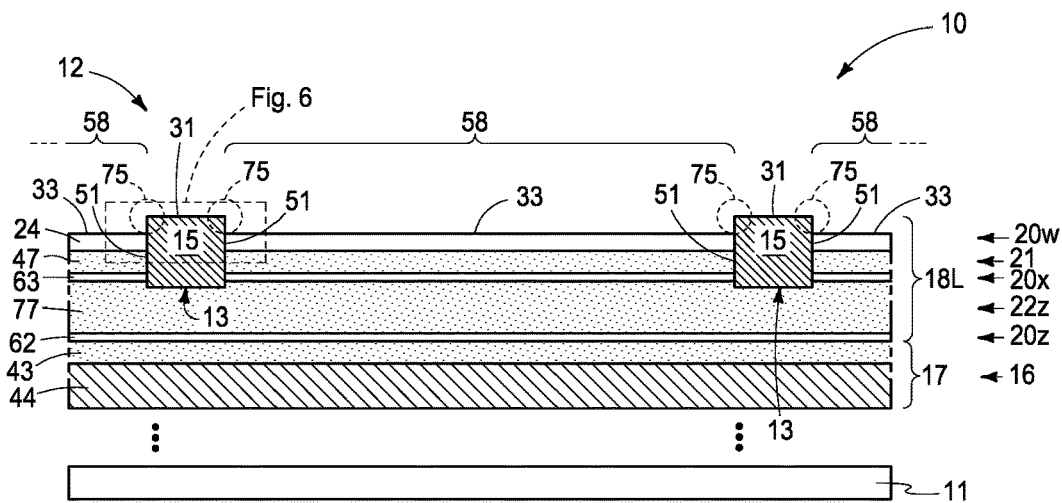
FIGS. 5-44 are diagrammatic sequential sectional and/or enlarged views of the construction of FIGS. 1-4, or portions thereof or alternate and/or additional embodiments, in process in accordance with some embodiments of the invention.
Figure 6:
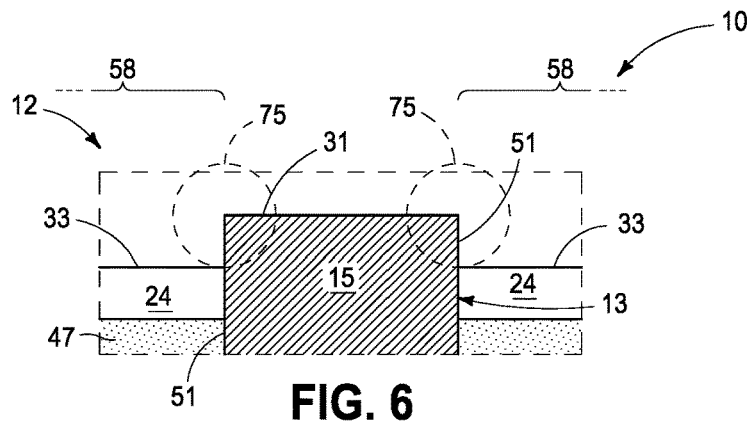
Figure 7:
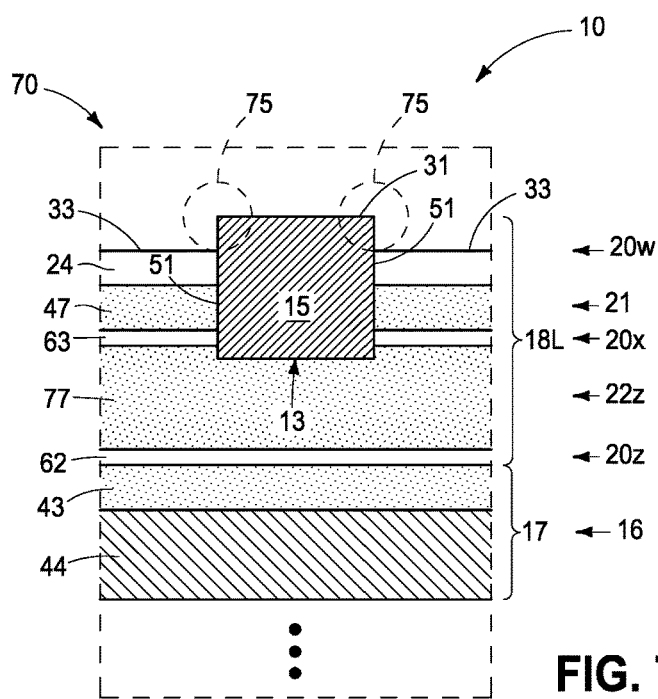
Figure 8:
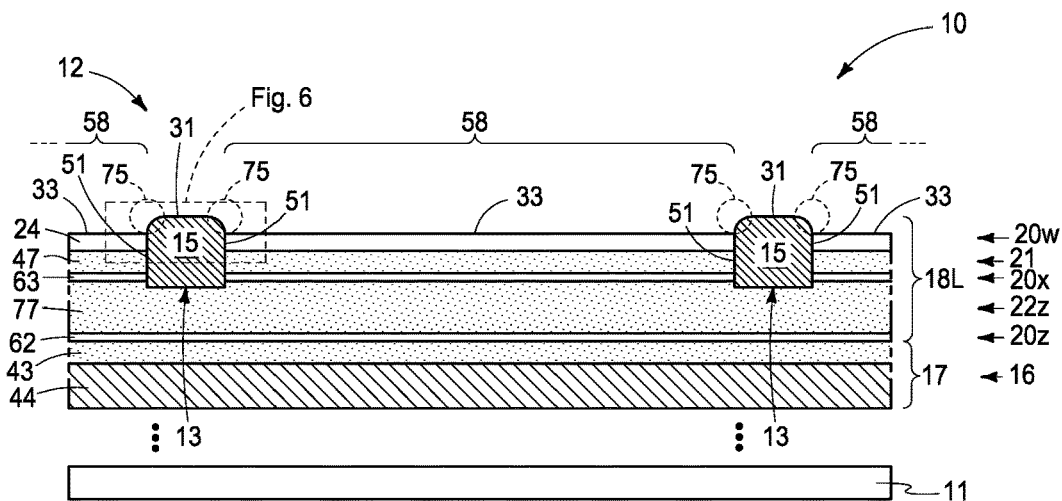
Figure 9:
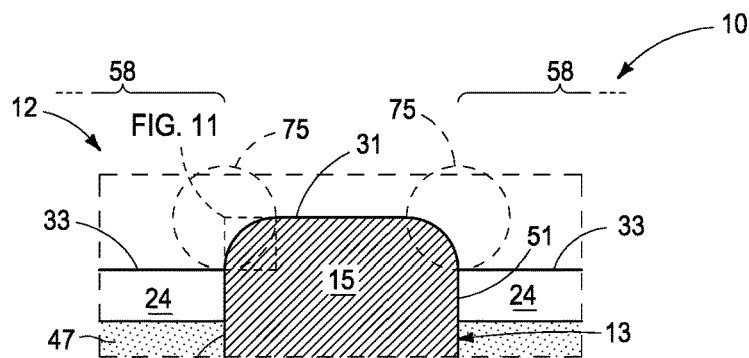
Figure 10:
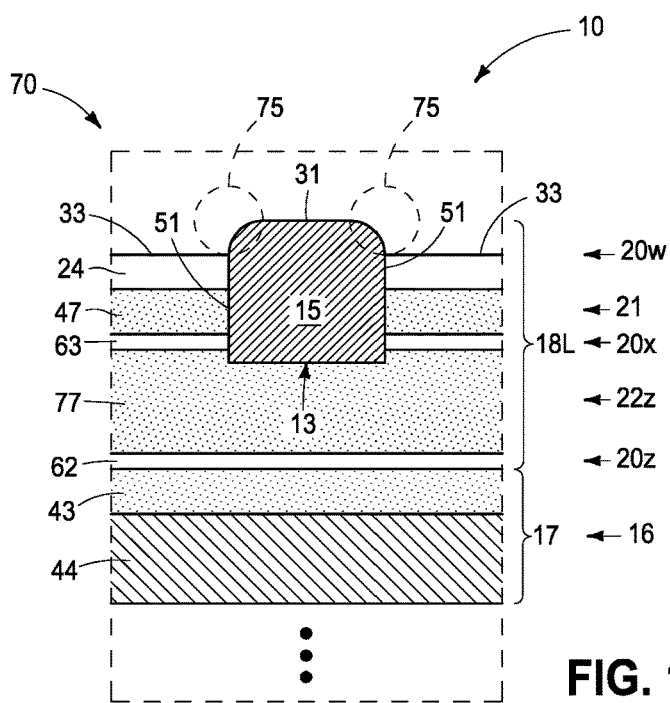
Figure 11:
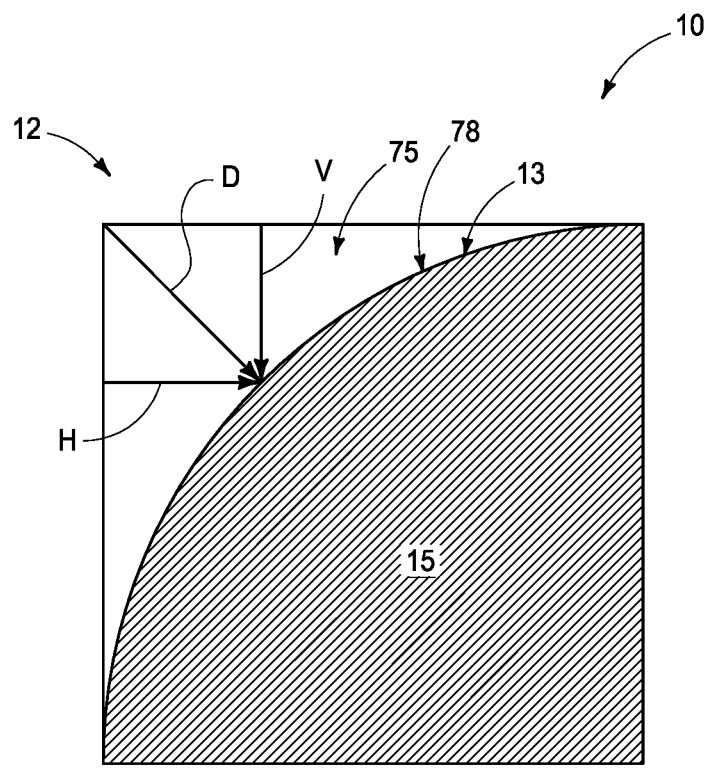
Figure 12:
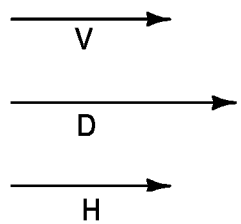

Referring to FIGS. 5-7, lower-portion material 62/77/63/47/24 has been removed (e.g., by etching) to have its uppermost surfaces 33 be lower than uppermost surfaces 31 of lines 13. Such is but, by way of example only, one manner of providing laterally-opposing uppermost corner regions 75 to be exposed above laterally-opposing line sidewalls 51 there-below, with laterally-opposing sidewalls 51 below corner regions 75 being covered by lower-portion material 62/77/63/47/24. In one embodiment and as shown, the processing shown by FIGS. 5 and 6 (a first region) has also occurred in second region 70 in FIG. 7.

Referring to FIGS. 8-12, sacrificial material 15 has been removed from exposed corner regions 75 in a greater amount diagonally (vector D) than orthogonally relative to exposed sidewalls 51 (51 in FIGS. 5-7, and vector H in FIGS. 11 and 12) of corner regions 75 and than orthogonally relative exposed tops 31 (31 in FIGS. 5-7, and vector V in FIGS. 11 and 12) of corner regions 75. By way of example only, for brevity, and for ease-of-depiction, the removal of sacrificial material 15 from exposed corner regions 75 results in corner regions 75 having a curved/rounded surface 78 that is along a constant radius (i.e., along an arc of a circle). Alternately, by way of example, such may result in a curved/rounded surface that is not along a constant radius (e.g., no portion thereof along any constant radius, some portion(s) thereof along a constant radius in combination with another/other portion(s) thereof not along a constant radius, etc. [not shown]) where D is greater than V and H which may not be equal relative one another. Further alternately, and by way of example, the removing of sacrificial material 15 from exposed corner region 75 may result in the surface corresponding to that of surface 78 to be entirely straight, have a combination of straight segments that are angled relative one another (at other than the straight angle), have a combination of straight and round/curved segments, etc. (not shown) where D is greater than V and H which may not be equal relative one another. In one embodiment and as shown, the processing shown by FIGS. 8 and 9 (a first region) has also occurred in second region 70 in FIG. 10.

In one embodiment, the removing of sacrificial material 15 from exposed corner regions 75 comprises etching, ideally isotropic etching. The artisan is capable of selecting suitable etching chemistry or chemistries to achieve a construction as shown and described above, with particular chemistries not otherwise being pertinent. By way of example only, where sacrificial material 15 comprises most metal materials, a mixture of phosphoric acid (80% by volume), nitric acid (1% by volume), acetic acid (1% b volume), and water (18% by volume) will so isotropically etch.

Figure 13:
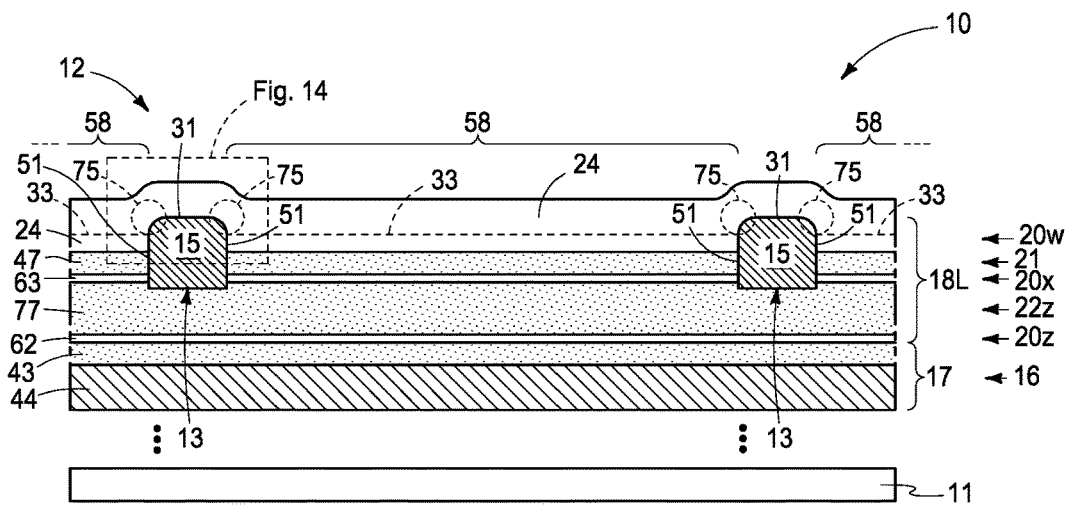
Figure 14:
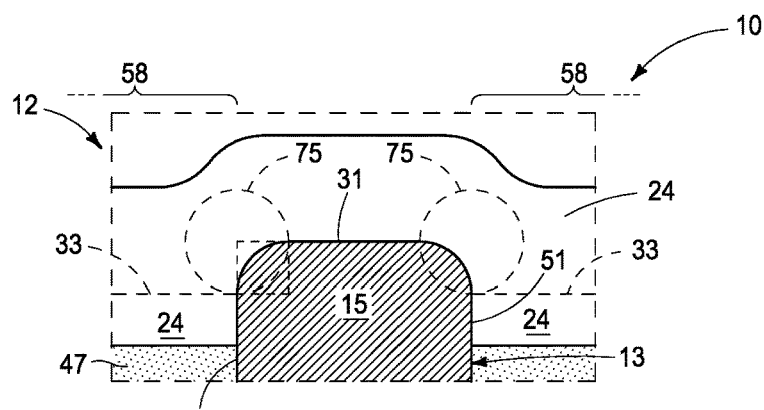
Figure 15:
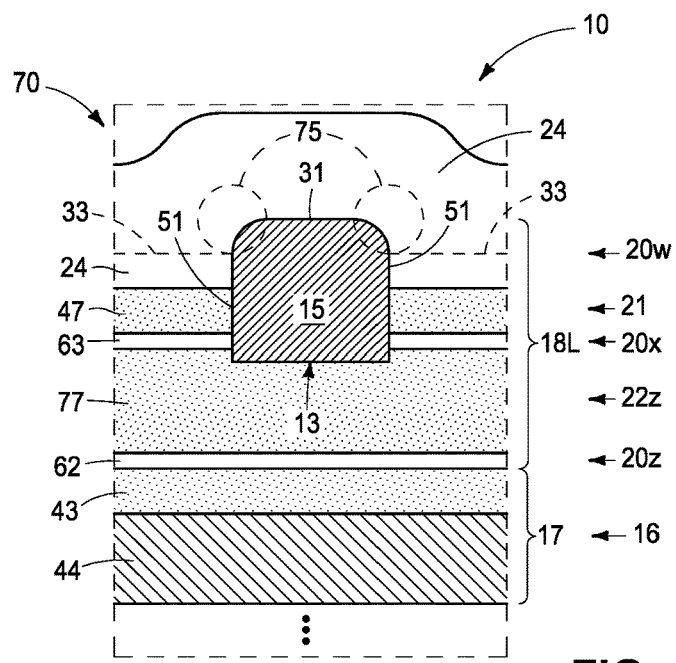

Referring to FIGS. 13-15, and in one embodiment, more material (for example, but not necessarily, material 24) has been formed over uppermost surfaces 31 of lines 13 and aside lines 13 to a greater thickness than thickness of lower-portion material 62/77/63/47/24 that was removed to have its uppermost surfaces be lower than the uppermost surfaces of lines 13. In one embodiment and as shown, the processing shown by FIGS. 13 and 14 (a first region) has also occurred in second region 70 in FIG. 15.

Figure 16:
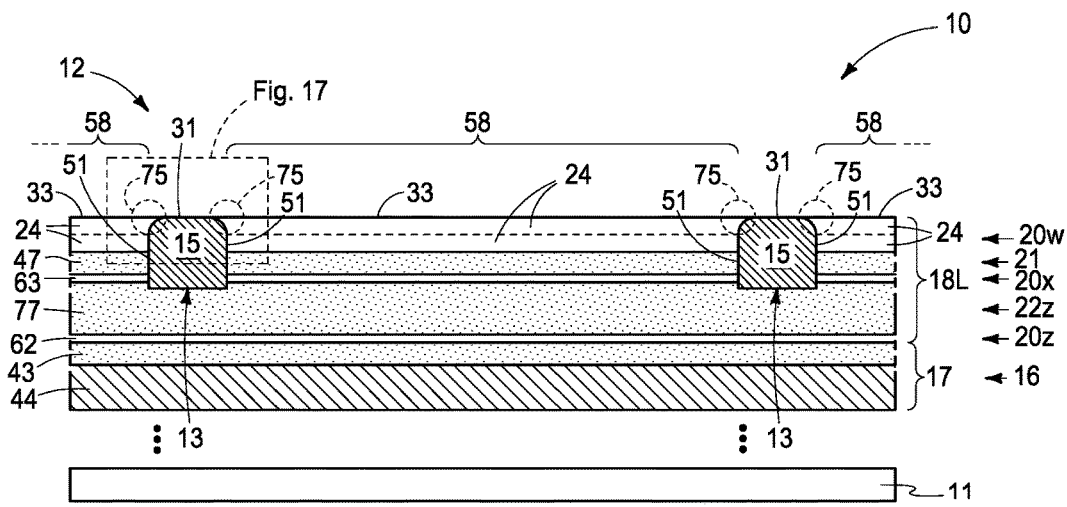
Figure 17:
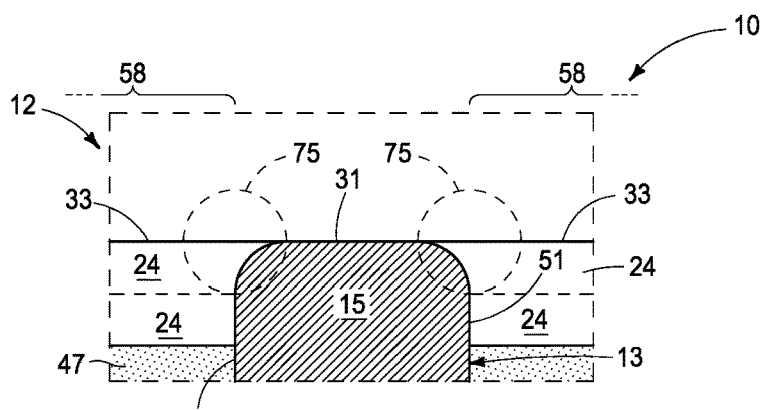
Figure 18:
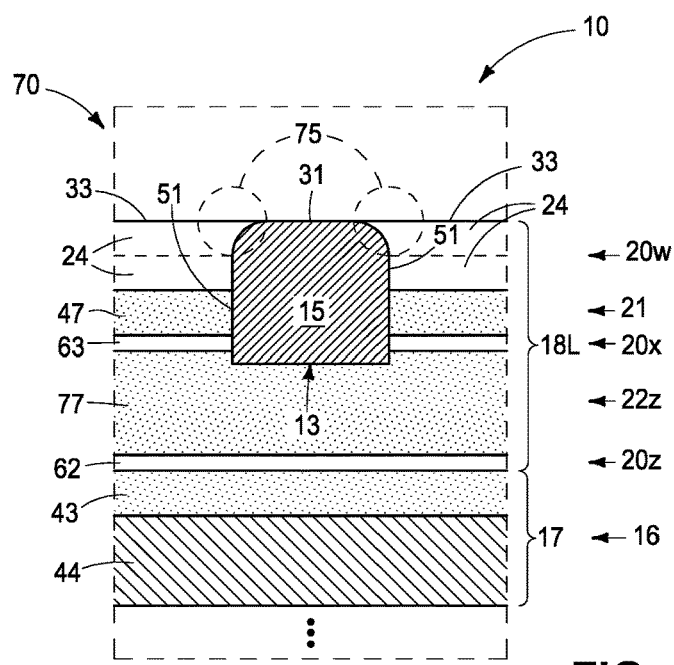
Figure 19:
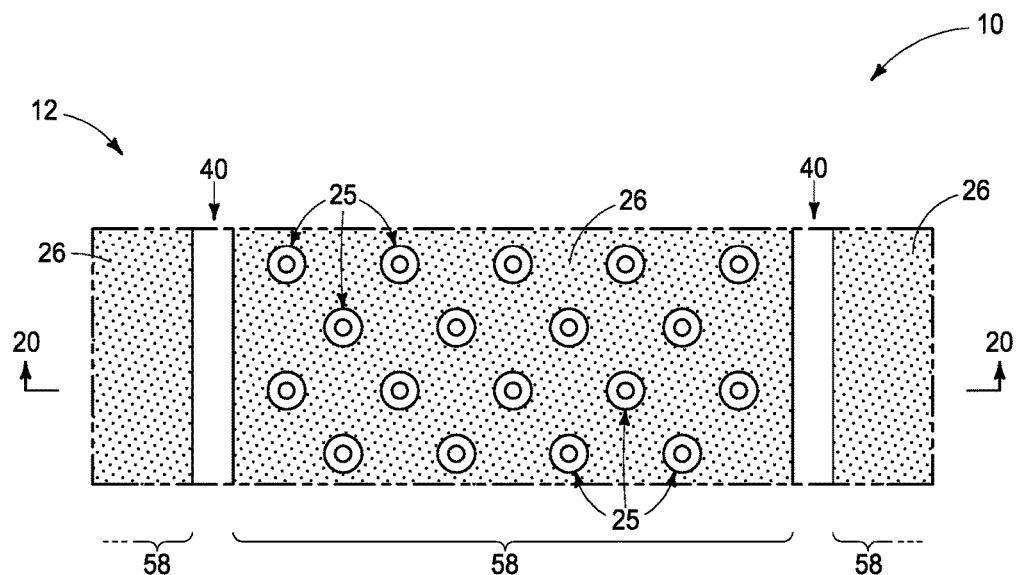
Figure 20:
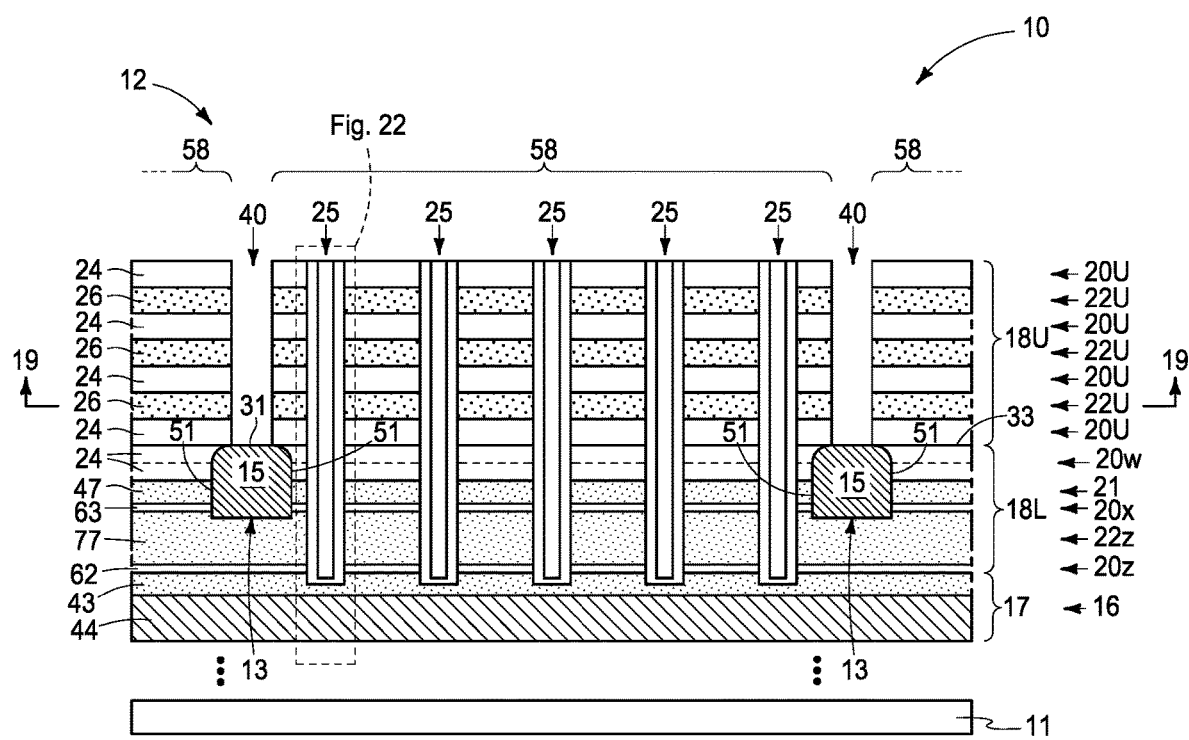
Figure 21:
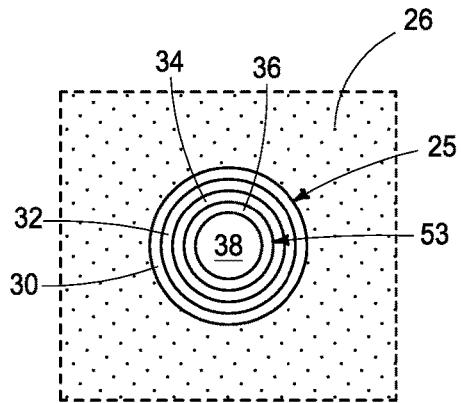
Figure 23:
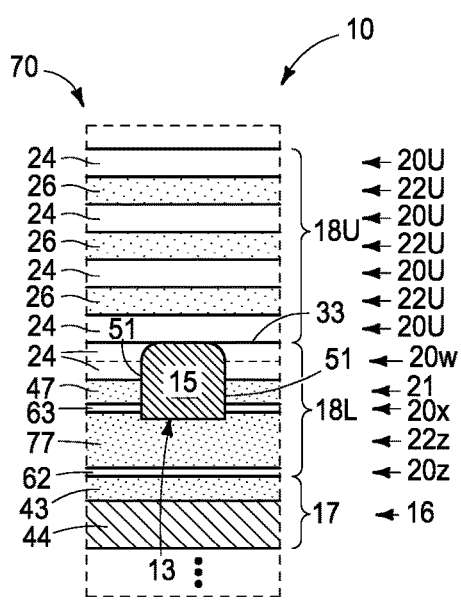
Figure 22:
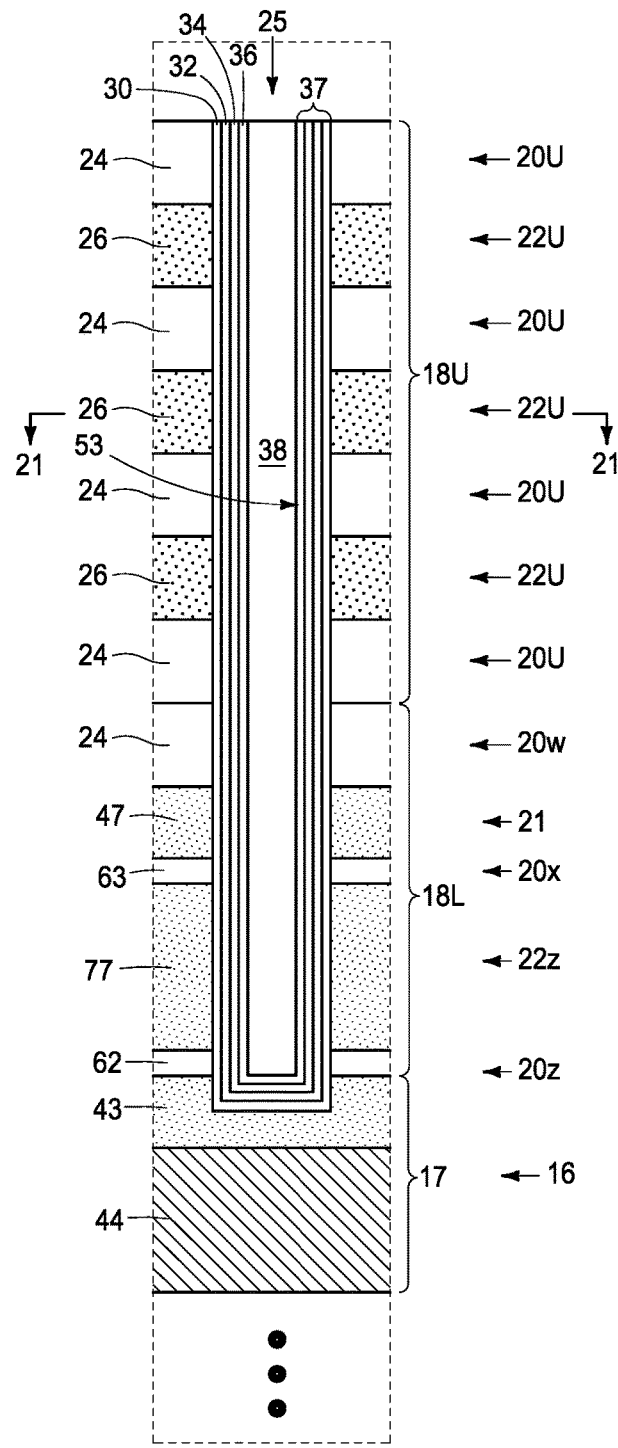

Referring to FIGS. 16-18, and in one embodiment, such more material (e.g., 24) has been planarized back at least to uppermost surfaces 31 of lines 13 such that lines 13 and the more material (e.g., 24) comprise respective uppermost surfaces 31 and 33 that are individually planar and collectively co-planar (e.g., by resist-etch-back or by chemical mechanical polishing). In one embodiment and as shown, the processing shown by FIGS. 16 and 17 (a first region) has also occurred in second region 70 in FIG. 18.

Referring to FIGS. 19-23 and after the removing of sacrificial material 15 from exposed corner regions 75, vertically-alternating different-composition first tiers 22U and second tiers 20U of an upper portion 18U of stack 18* have been formed above lower portion 18L and lines 13. First tiers 22U may be conductive and second tiers 20U may be insulative, yet need not be so at this point of processing in conjunction with the hereby initially-described example method embodiment which is "gate-last" or "replacement-gate" Example upper portion 18U is shown starting above lower portion 18L with a second tier 20U (e.g., thus forming a single, combined second tier 20w/20U between conducting/conductive tiers 21 and 22U) although such could alternately start with a first tier 22U (not shown). Further, and by way of example, lower portion 18L may be formed to have one or more first and/or second tiers as a top thereof. Regardless, only a small number of tiers 20U and 22U is shown, with more likely upper portion 18U (and thereby stack 18*) comprising dozens, a hundred or more, etc. of tiers 20* and 22*. Further, other circuitry that may or may not be part of peripheral and/or control circuitry may be between conductor tier 16 and stack 18*. By way of example only, multiple vertically-alternating tiers of conductive material and insulative material of such circuitry may be below a lowest of conductive tiers 22* and/or above an uppermost of conductive tiers 22%. For example, one or more select gate tiers (not shown) may be between conductor tier 16 and the lowest conductive tier 22* and one or more select gate tiers may be above an uppermost of conductive tiers 22*. Alternately or additionally, at least one of the depicted uppermost and lowest conductive tiers 22* may be a select gate tier.

Channel openings 25 have been formed (e.g., by etching) through second tiers 20* and first tiers 22* in upper portion 18U to lower portion 18L (e.g., at least to lowest first tier 22z in lower portion 18L. Channel openings 25 may taper radially-inward (not shown) moving deeper into stack 18. In some embodiments, channel openings 25 may go into conductor material 17 of conductor tier 16 as shown or may stop there-atop (not shown). Alternately, as an example, channel openings 25 may stop atop or within the lowest second tier 20z. A reason for extending channel openings 25 at least to conductor material 17 of conductor tier 16 is to provide an anchoring effect to material that is within channel openings 25. Etch-stop material (not shown) may be within or atop conductive material 17 of conductor tier 16 to facilitate stopping of the etching of channel openings 25 relative to conductor tier 16 when such is desired. Such etch-stop material may be sacrificial or non-sacrificial.

Transistor channel material may be formed in the individual channel openings elevationally along the insulative tiers and the conductive tiers, thus comprising individual channel-material strings, which is directly electrically coupled with conductive material in the conductor tier. Individual memory cells of the example memory array being formed may comprise a gate region (e.g., a control-gate region) and a memory structure laterally-between the gate region and the channel material. In one such embodiment, the memory structure is formed to comprise a charge-blocking region, storage material (e.g., charge-storage material), and an insulative charge-passage material. The storage material (e.g., floating gate material such as doped or undoped silicon or charge-trapping material such as silicon nitride, metal dots, etc.) of the individual memory cells is elevationally along individual of the charge-blocking regions. The insulative charge-passage material (e.g., a band gap-engineered structure having nitrogen-containing material [e.g., silicon nitride] sandwiched between two insulator oxides [e.g., silicon dioxide]) is laterally-between the channel material and the storage material.

FIGS. 19-22 show one embodiment wherein charge-blocking material 30, storage material 32, and charge-passage material 34 have been formed in individual channel openings 25 elevationally along insulative tiers 20 and conductive tiers 22 Transistor materials 30, 32, and 34 (e.g., memory-cell materials) may be formed by, for example, deposition of respective thin layers thereof over stack 18* and within individual openings 25 followed by planarizing such back at least to a top surface of stack 18*.

Channel material 36 as a channel-material string 53 has also been formed in channel openings 25 elevationally along insulative tiers 20 and conductive tiers 22. Materials 30, 32, 34, and 36 are collectively shown as and only designated as material 37 in some figures due to scale. Example channel materials 36 include appropriately-doped crystalline semiconductor material, such as one or more silicon, germanium, and so-called III/V semiconductor materials (e.g., GaAs, InP, GaP, and GaN). Example thickness for each of materials 30, 32, 34, and 36 is 25 to 100 Angstroms. Punch etching may be conducted to remove materials 30, 32, and 34 from the bases of channel openings 25 (not shown) to expose conductor tier 16 such that channel material 36 is directly against conductor material 17 of conductor tier 16. Such punch etching may occur separately with respect to each of materials 30, 32, and 34 (as shown) or may occur with respect to only some (not shown). Alternately, and by way of example only, no punch etching may be conducted and channel material 36 may be directly electrically coupled to conductor material 17 of conductor tier 16 only by a separate conductive interconnect (not yet shown). Regardless, sacrificial etch-stop plugs (not shown) may be formed in lower portion 18L in horizontal locations where channel openings 25 will be prior to forming upper portion 18U. Channel openings 25 may then be formed by etching materials 24 and 26 to stop on or within the material of the sacrificial plugs, followed by exhuming remaining material of such plugs prior to forming material in channel openings 25. A radially-central solid dielectric material 38 (e.g., spin-on-dielectric, silicon dioxide, and/or silicon nitride) is shown in channel openings 25. Alternately, and by way of example only, the radially-central portion within channel openings 25 may include void space(s) (not shown) and/or be devoid of solid material (not shown).

Horizontally-elongated trenches 40 have been formed (e.g., by anisotropic etching) into stack 18* through upper portion 18U and that are individually between immediately-laterally-adjacent memory-block regions 58 and that extend to the individual line 13 there-between in lower portion 18L. Trenches 40 may taper laterally-inward or laterally-outward moving deeper into stack 18U (not shown). In one embodiment and as shown, individual trenches 40 where joining with its individual line 13 there-below are narrower than uppermost surface 31 of its individual line 13 there-below at least prior to the removing of sacrificial material 15 from exposed corner regions 75 (FIGS. 5 and 6). In one embodiment and as shown, trenches 40 have been formed in FIGS. 19-22 (a first region) and have not been formed in second region 70 in FIG. 23. By way of example and for brevity only, channel openings 25 are shown as being arranged in groups or columns of staggered rows of four and five channel openings 25 per row. Trenches 40 will typically be wider than channel openings 25 (e.g., 10 to 20 times wider, yet such wider degree not being shown for brevity). Any alternate existing or future-developed arrangement and construction may be used. Trenches 40 and channel openings 25 may be formed in any order relative the other or at the same time.

Figure 24:
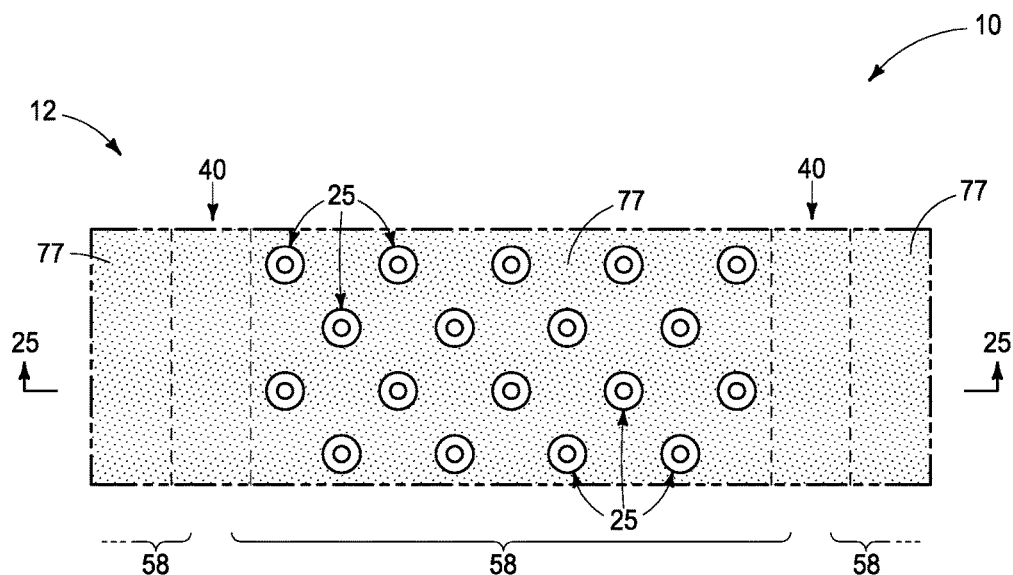
Figure 25:
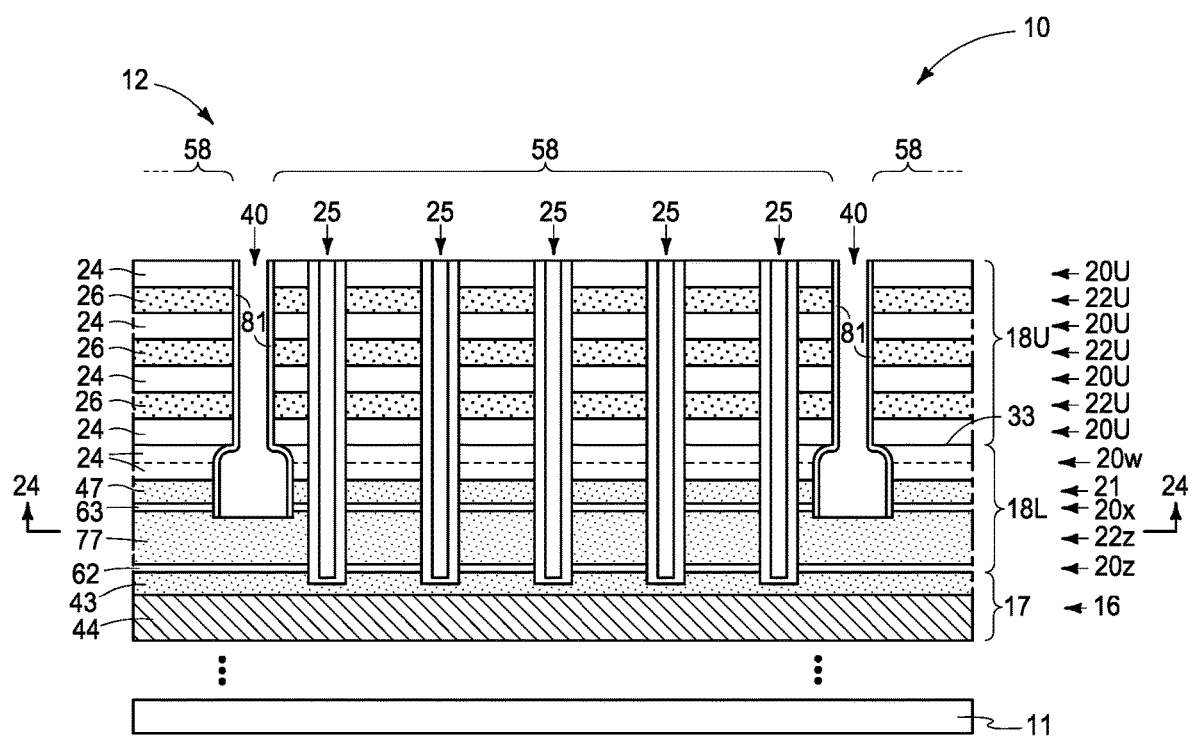
Figure 26:
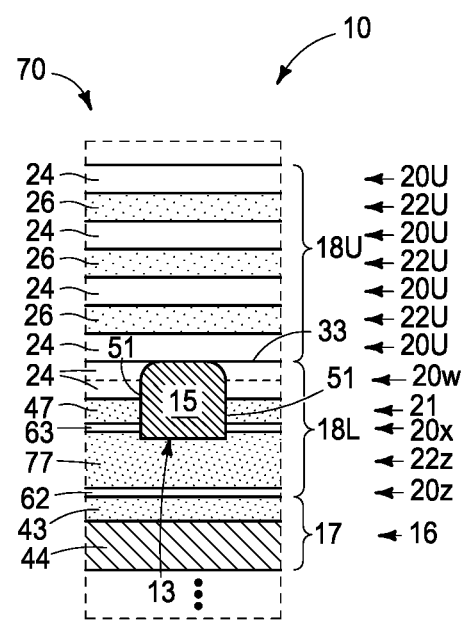

Referring to FIGS. 24-26, sacrificial material 15 of lines 13 (not shown in FIGS. 24 and 25) has been removed through trenches 40 (e.g., by isotropic etching, for example using a mixture of ammonia and hydrogen peroxide or a mixture of sulfuric acid and hydrogen peroxide if material 15 comprises W). An optional thin sacrificial liner 81 (e.g., hafnium oxide, aluminum oxide, multiple layers of the same or other materials, etc.) has then be formed in trenches 40, followed by punch-etching there-through to expose material 77. In one embodiment and as shown, the processing shown by FIGS. 24 and 25 (a first region) has not occurred in second region 70 in FIG. 18.

Ultimately, through trenches 40 and through void-spaces left as a result of the removing of sacrificial material 15 of lines 13, conductive material is formed in lower portion 18L that directly electrically couples together channel material 36 of individual channel-material strings 53 and conductor material 17 of conductor tier 16. Example methods of doing so are described with reference to FIGS. 27-36.

Figure 27:
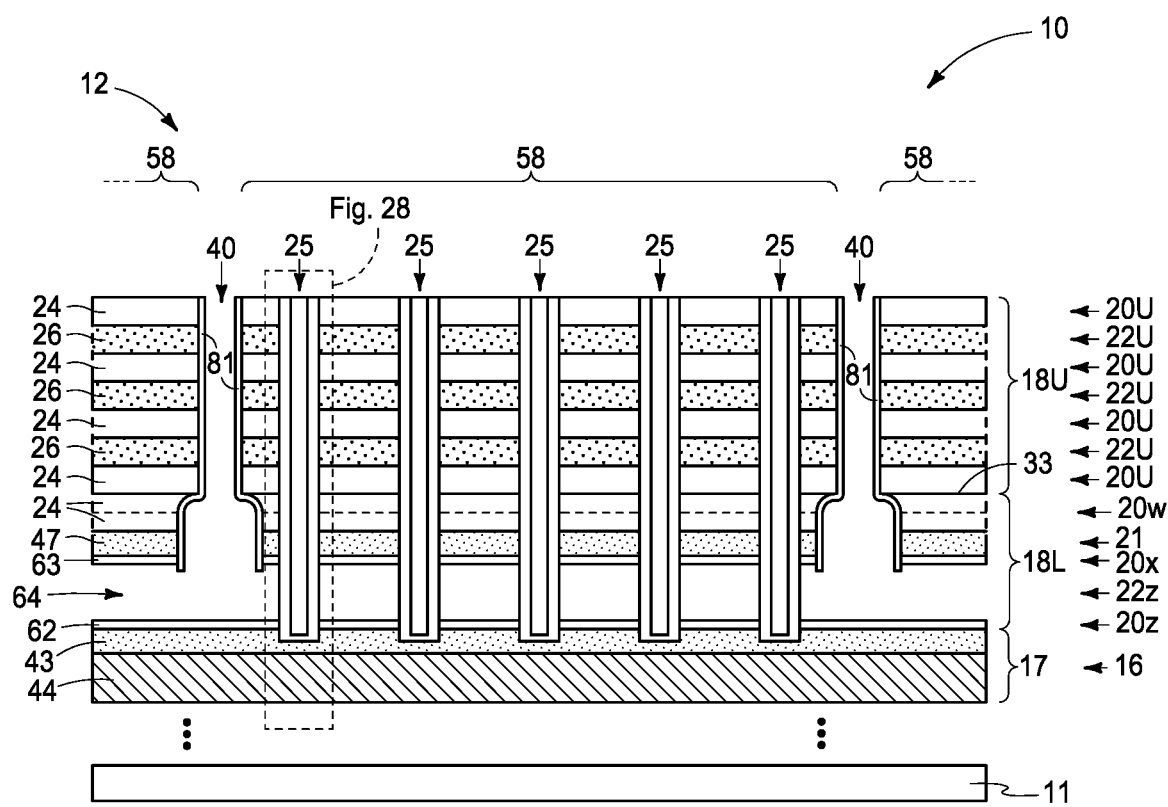
Figure 28:
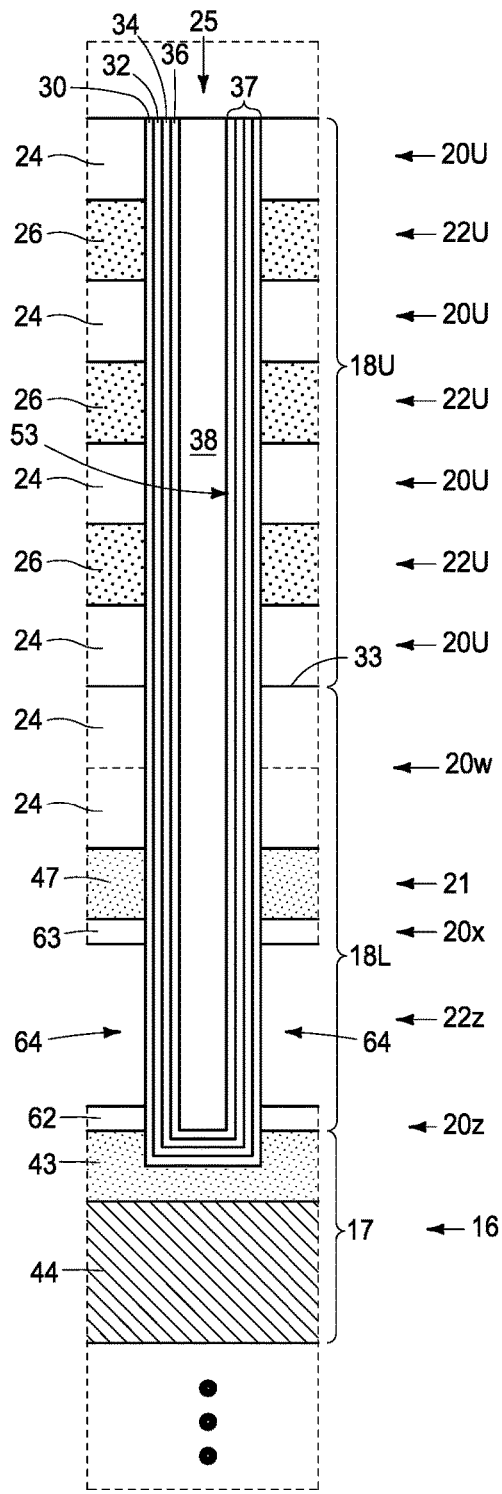
Figure 29:
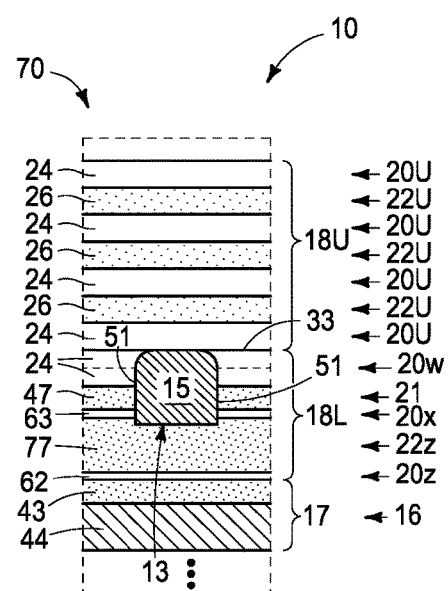

Referring to FIGS. 27-29, material 77 (not shown in FIGS. 27 and 28) has been removed from lowest first tier 22z through trenches 40, thus leaving or forming a void space 64 vertically between lowest second tier 20z and next-lowest second tier 20x. Such may occur, for example, by isotropic etching that is ideally conducted selectively relative to materials 62 and 63, for example using liquid or vapor $H_3PO_4$ as a primary etchant where material 77 is silicon nitride or using tetramethyl ammonium hydroxide [TMAH] where material 77 is polysilicon. In one embodiment and as shown, removal of material 77 has not occurred in second region 70.

Figure 30:
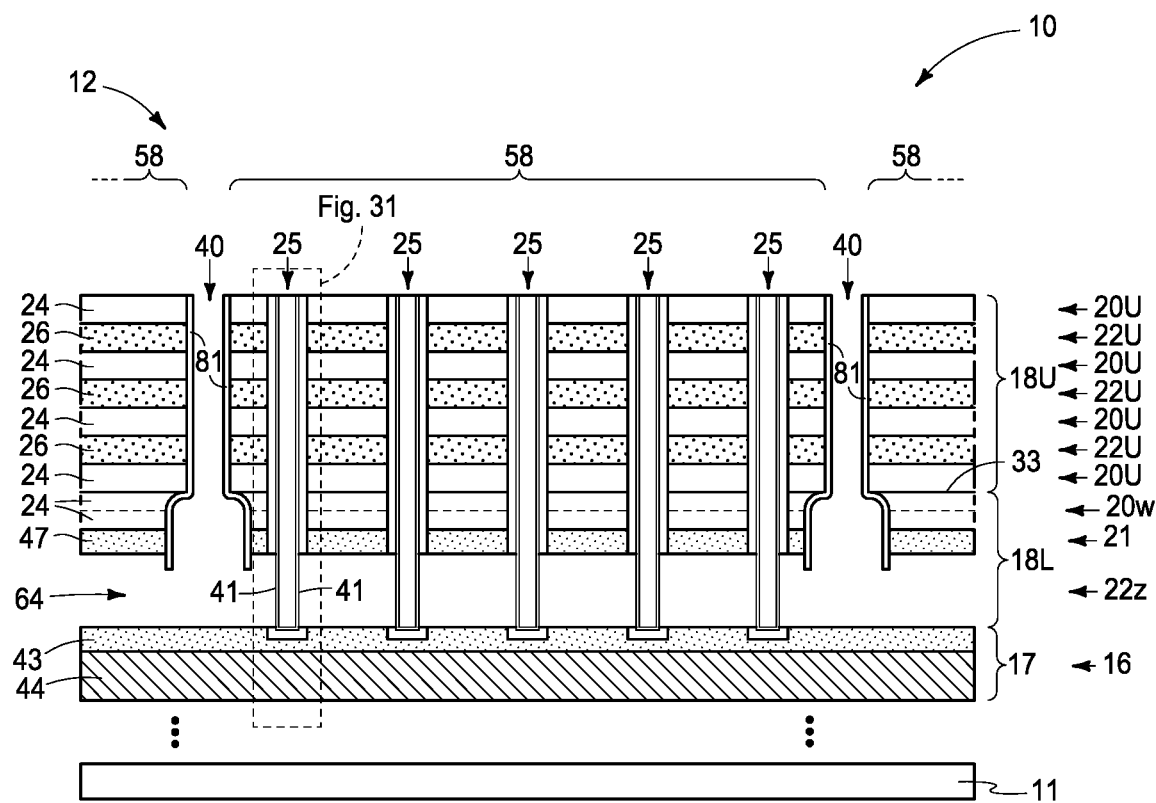
Figure 31:
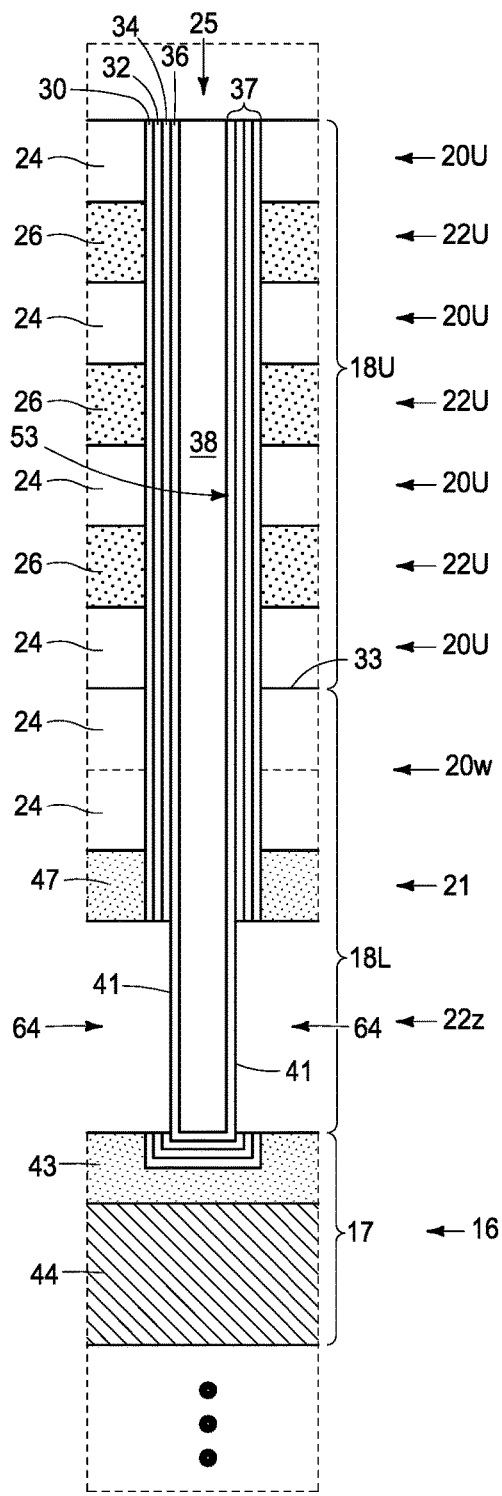
Figure 32:
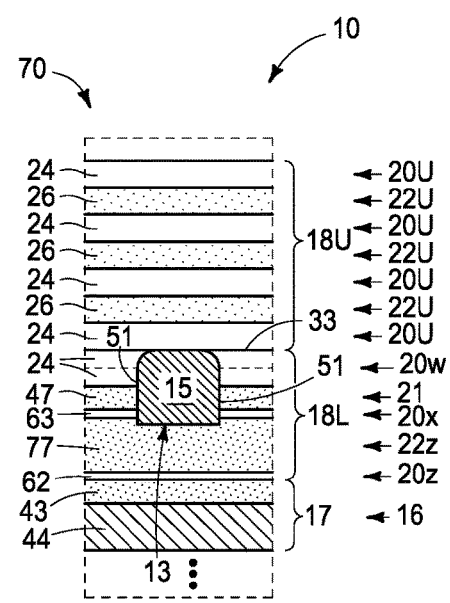

FIGS. 30-32 show example subsequent processing wherein, in one embodiment, material 30 (e.g., silicon dioxide), material 32 (e.g., silicon nitride), and material 34 (e.g., silicon dioxide or a combination of silicon dioxide and silicon nitride) have been etched in tier 22z to expose a sidewall 41 of channel material 36 of channel-material strings 53 in lowest first tier 22z. Any of materials 30, 32, and 34 in tier 22z may be considered as being sacrificial material therein. As an example, consider an embodiment where liner 81 is one or more insulative oxides (other than silicon dioxide) and memory-cell materials 30, 32, and 34 individually are one or more of silicon dioxide and silicon nitride layers. In such example, the depicted construction can result by using modified or different chemistries for sequentially etching silicon dioxide and silicon nitride selectively relative to the other. As examples, a solution of 100:1 (by volume) water to HF will etch silicon dioxide selectively relative to silicon nitride, whereas a solution of 1000:1 (by volume) water to HF will etch silicon nitride selectively relative to silicon dioxide. Accordingly, and in such example, such etching chemistries can be used in an alternating manner where it is desired to achieve the example depicted construction. In one embodiment and as shown, such etching has been conducted selectively relative to liner 81 (when present). FIGS. 30 and 31, and in one embodiment, also show materials 62 and 63 (not shown) as having been removed. When so removed, such may be removed when removing materials 30, 32, and 34 are removed, for example if materials 62 and 63 comprise one or both of silicon dioxide and silicon nitride. Alternately, when so removed, such may be removed separately (e.g., by isotropic etching). The artisan is capable of selecting other chemistries for etching other different materials where a construction as shown is desired. In one embodiment and as shown, the processing shown by FIGS. 30 and 31 (a first region) has not occurred in second region 70 in FIG. 32.

Figure 33:
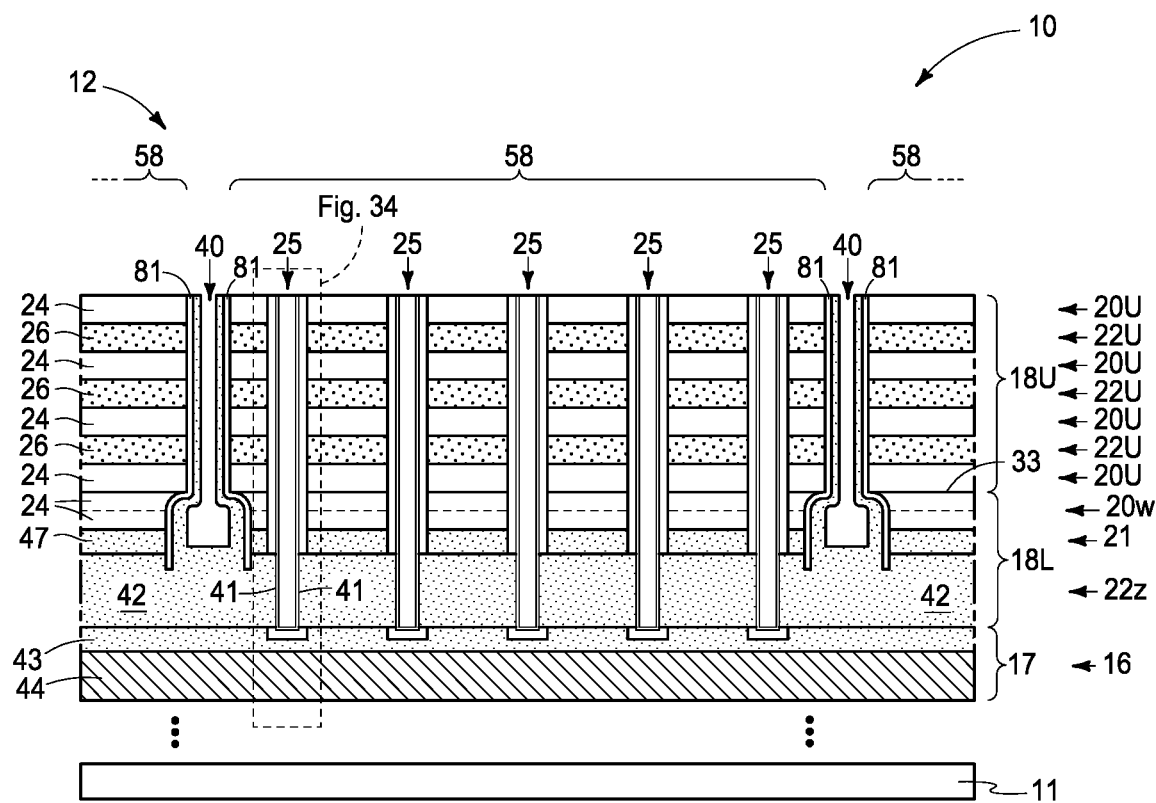
Figure 34:
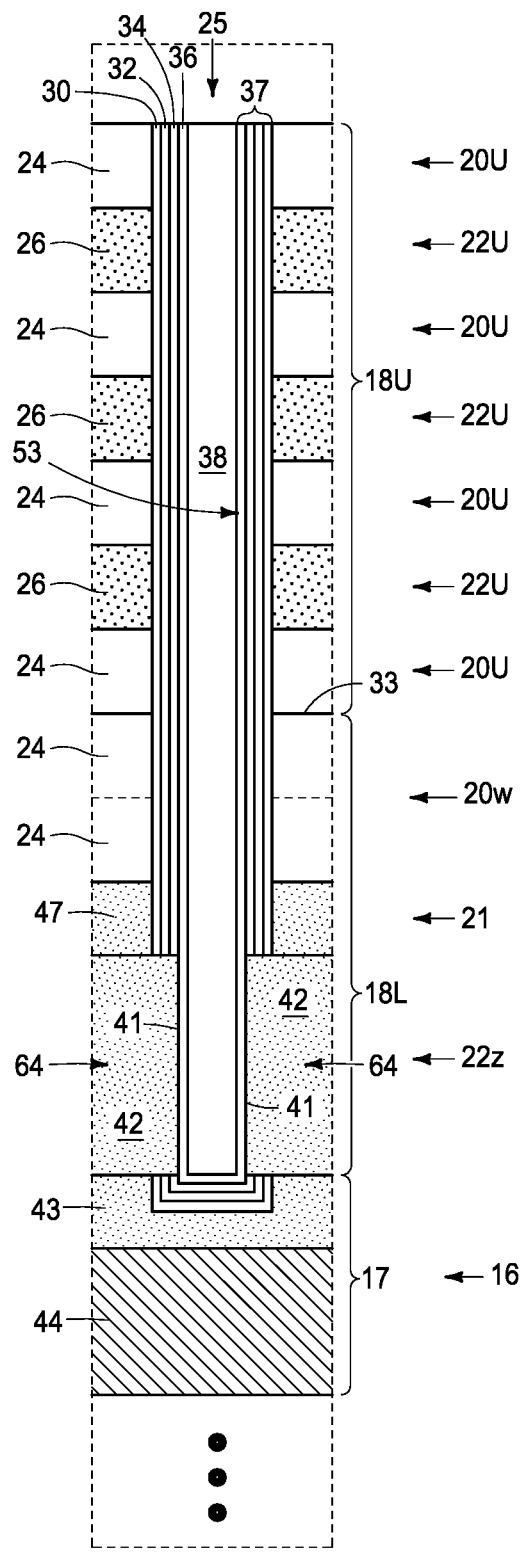
Figure 35:
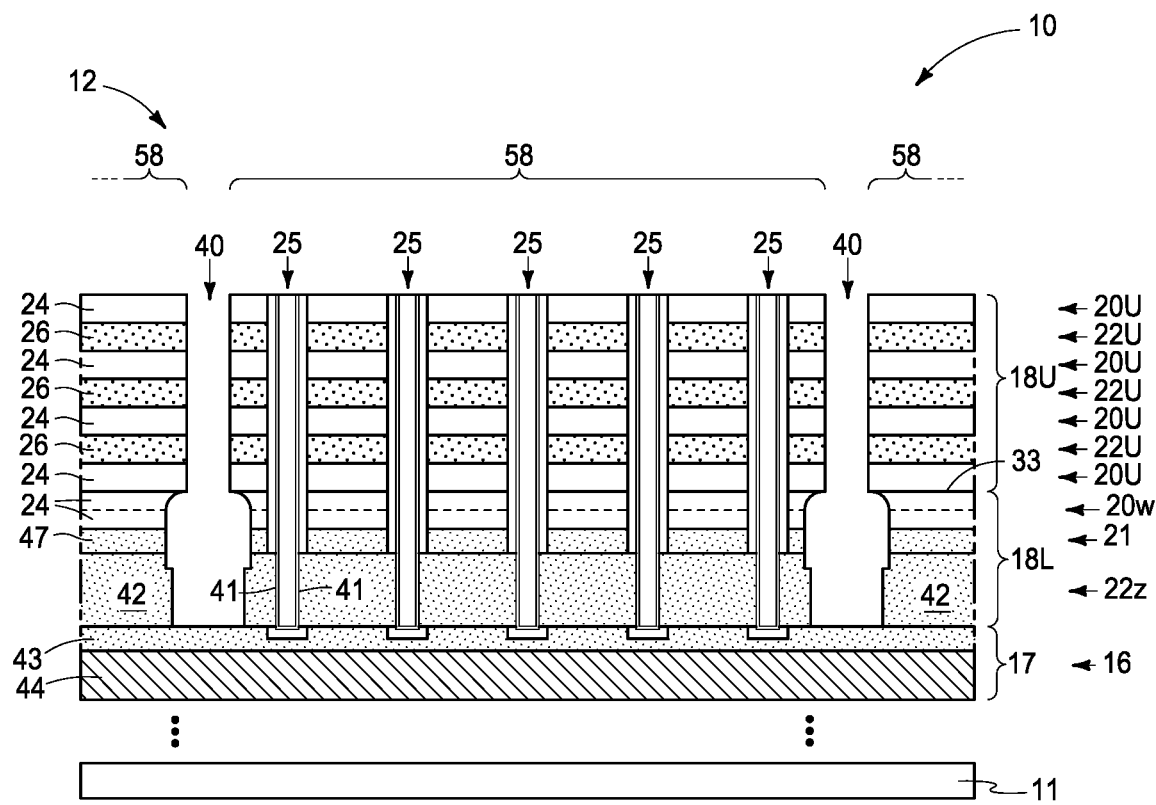
Figure 36:
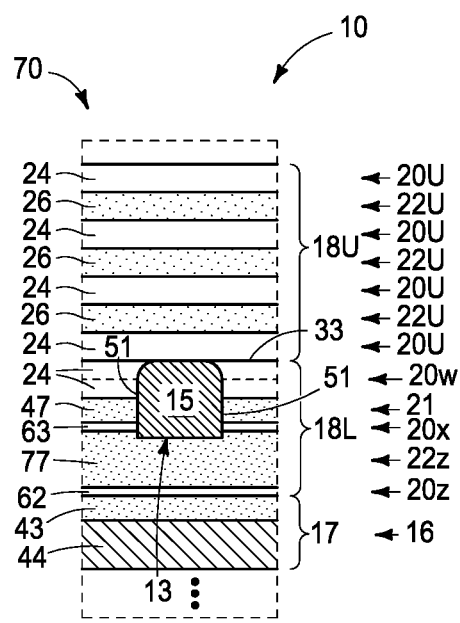
Figure 37:
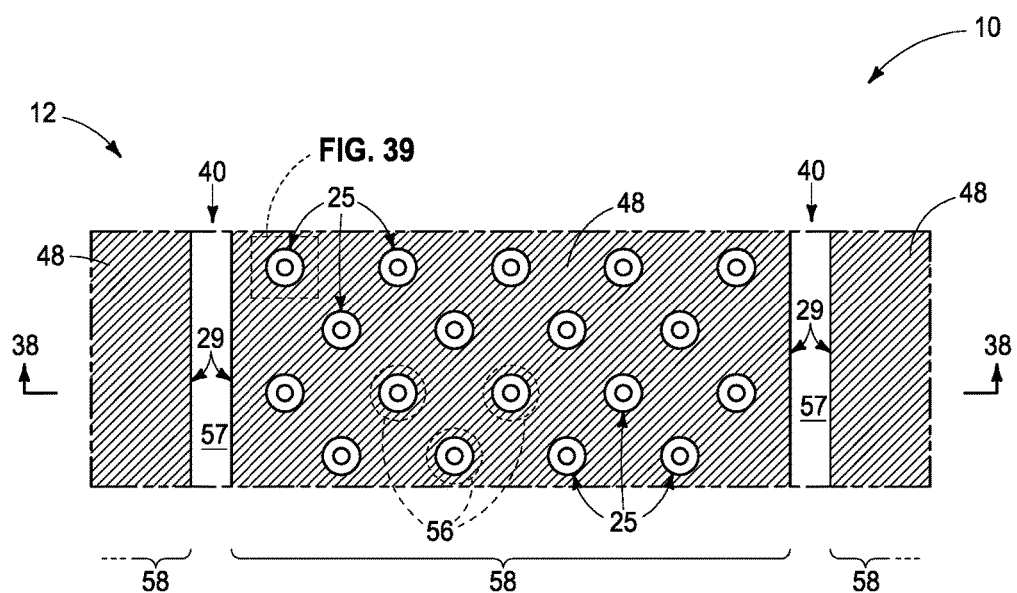
Figure 38:
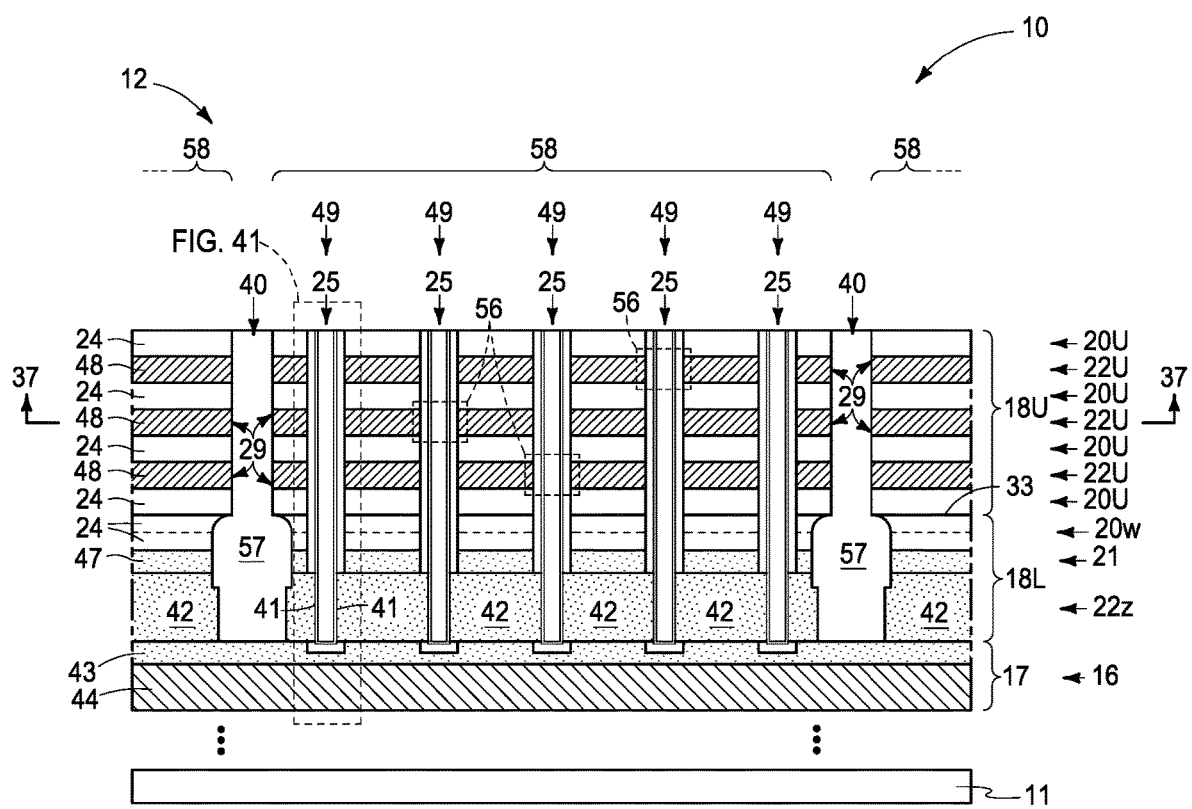
Figure 39:
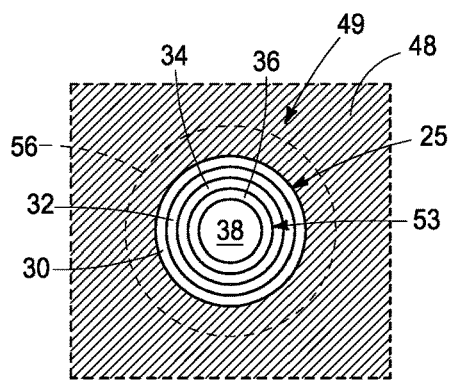
Figure 40:
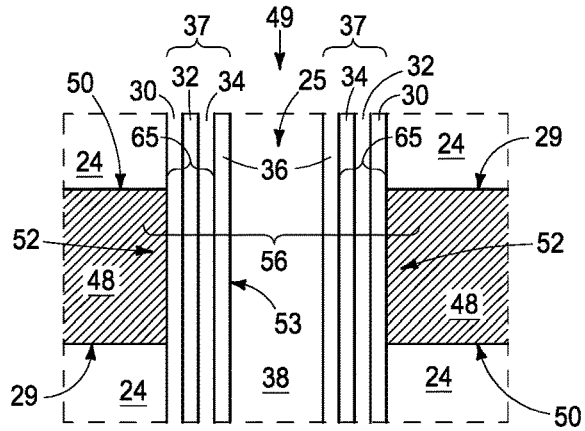

Referring to FIGS. 33 and 34, conducting material 42 (e.g., conductively-doped polysilicon) has been formed in lowest first tier 22z and in one embodiment directly against sidewall 41 of channel material 36. In one embodiment and as shown, such has been formed directly against a bottom of conducting material 47 of conducting tier 21 and directly against a top of conductor material 43 of conductor tier 16, thereby directly electrically coupling together channel material 36 of individual channel-material strings 53 with conductor material 43 of conductor tier 16 and conducting material 47 of conducting tier 21. Conducting material 42 is shown as lining sidewall space in tiers 20w and 21 that is left by the removing of material 15 of lines 13 as shown in FIG. 25. FIGS. 35 and 36 show subsequent removal of conducting material 42 from such sidewall space and from trenches 40 and removal of sacrificial liner 81 (not shown). Sacrificial liner 81 may be removed before forming conducting material 42 (not shown). In one embodiment and as shown, the processing shown by FIGS. 33-35 (a first region) has not occurred in second region 70 in FIG. 36. In methods prior to this disclosure, conductive material 42 may remain below a horizontal ceiling that is laterally-outward of trenches 40 in lower portion 18L and that can lead to shorting and/or a totally-inoperative or partially-inoperative final construction.

Referring to FIGS. 37-42, material 26 (not shown) of conductive tiers 22U has been removed, for example by being isotropically etched away through trenches 40 ideally selectively relative to the other exposed materials (e.g., using liquid or vapor $H_3PO_4$ as a primary etchant where material 26 is silicon nitride and other materials comprise one or more oxides or polysilicon). Material 26 (not shown) in conductive tiers 22U in the example embodiment is sacrificial and has been replaced with conducting material 48, and which has thereafter been removed from trenches 40, thus forming individual conductive lines 29 (e.g., wordlines) and elevationally-extending strings 49 of individual transistors and/or memory cells 56.

A thin insulative liner (e.g., $Al_2O_3$ and not shown) may be formed before forming conducting material 48. Approximate locations of some transistors and/or some memory cells 56 are indicated with a bracket or with dashed outlines, with transistors and/or memory cells 56 being essentially ring-like or annular in the depicted example. Alternately, transistors and/or memory cells 56 may not be completely encircling relative to individual channel openings 25 such that each channel opening 25 may have two or more elevationally-extending strings 49 (e.g., multiple transistors and/or memory cells about individual channel openings in individual conductive tiers with perhaps multiple wordlines per channel opening in individual conductive tiers, and not shown). Conducting material 48 may be considered as having terminal ends 50 corresponding to control-gate regions 52 of individual transistors and/or memory cells 56. Control-gate regions 52 in the depicted embodiment comprise individual portions of individual conductive lines 29. Materials 30, 32, and 34 may be considered as a memory structure 65 that is laterally between control-gate region 52 and channel material 36. In one embodiment and as shown with respect to the example "gate-last" processing, conducting material 48 of conductive tiers 22* is formed after forming openings 25 and/or trenches 40. Alternately, the conducting material of the conductive tiers may be formed before forming channel openings 25 and/or trenches 40 (not shown), for example with respect to "gate-first" processing.

A charge-blocking region (e.g., charge-blocking material 30) is between storage material 32 and individual control-gate regions 52. A charge block may have the following functions in a memory cell: In a program mode, the charge block may prevent charge carriers from passing out of the storage material (e.g., floating-gate material, charge-trapping material, etc.) toward the control gate, and in an erase mode the charge block may prevent charge carriers from flowing into the storage material from the control gate. Accordingly, a charge block may function to block charge migration between the control-gate region and the storage material of individual memory cells. An example charge-blocking region as shown comprises insulator material 30. By way of further examples, a charge-blocking region may comprise a laterally (e.g., radially) outer portion of the storage material (e.g., material 32) where such storage material is insulative (e.g., in the absence of any different-composition material between an insulative storage material 32 and conducting material 48). Regardless, as an additional example, an interface of a storage material and conductive material of a control gate may be sufficient to function as a charge-blocking region in the absence of any separate-composition-insulator material 30. Further, an interface of conducting material 48 with material 30 (when present) in combination with insulator material 30 may together function as a charge-blocking region, and as alternately or additionally may a laterally-outer region of an insulative storage material (e.g., a silicon nitride material 32). An example material 30 is one or more of silicon hafnium oxide and silicon dioxide.

Intervening material 57 has been formed in trenches 40 and in sidewall space in tiers 20w and 21 that is left by the removing of material 15 of lines 13 as shown in FIG. 25, and thereby laterally-between and longitudinally-along immediately-laterally-adjacent memory blocks 58 Intervening material 57 may provide lateral electrical isolation (insulation) between immediately-laterally-adjacent memory blocks. Such may include one or more of insulative, semi-conductive, and conducting materials and, regardless, may facilitate conductive tiers 22 from shorting relative one another in a finished circuitry construction. Example insulative materials are one or more of $SiO_2$, $Si_3N_4$, $Al_2O_3$, and undoped polysilicon. Intervening material 57 may include through array vias (not shown).

Figure 42:
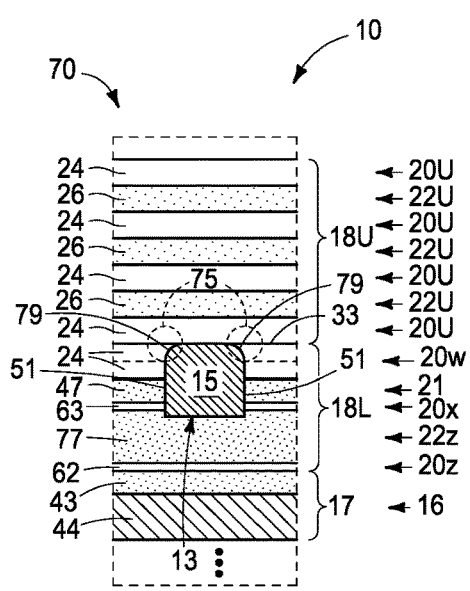
Figure 41:
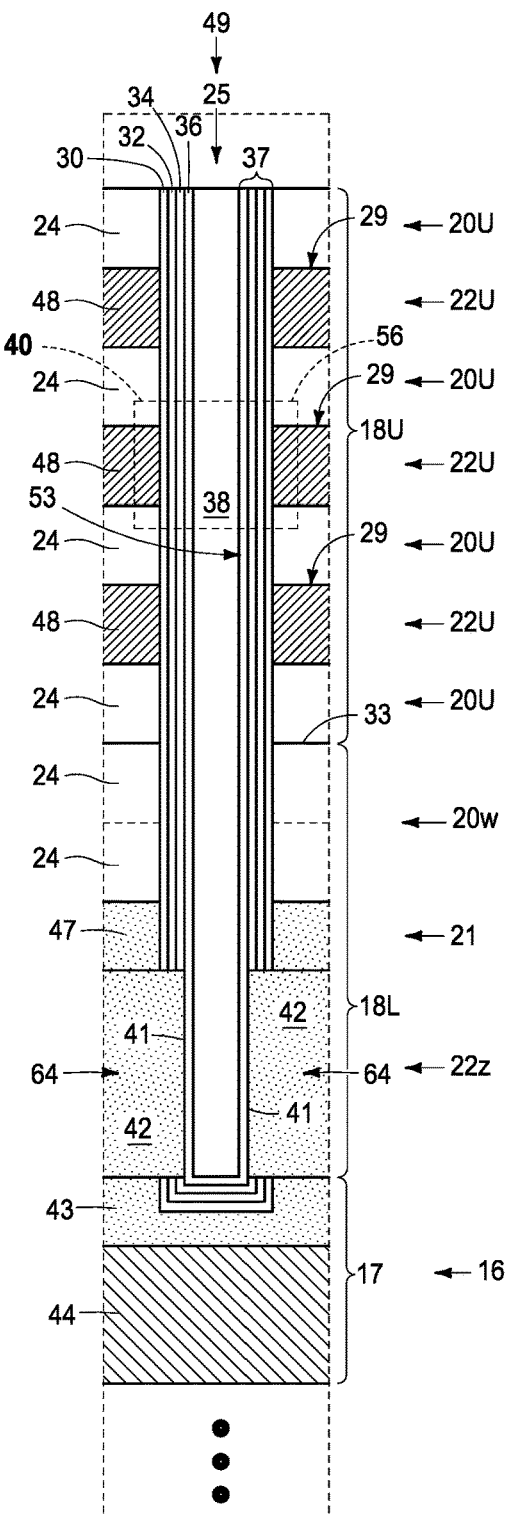

In one embodiment and as shown, the forming of conducting material 48 occurs with respect to the first vertical stack 18* in a first region (FIGS. 37-41) and not with respect to the second vertical stack 18* in second region 70 (FIG. 42). In one embodiment, horizontal line 13 in second vertical stack 18* is conductive and dummy (i.e., meaning no current flow there-through and which may be a circuit inoperable dead end that is not part of a current flow path of a circuit even if extending to or from an electronic component). In one embodiment, horizontal line 13 in second vertical stack 18* is insulative.

In one embodiment, horizontal line 13 in second vertical stack 18* does not extend upwardly into upper portion 18U, and in one such embodiment has uppermost laterally-opposing uppermost corner regions 75 in lower portion 18U that individually have a curved outermost surface 79 (FIG. 42).

Any other attribute(s) or aspect(s) as shown and/or described herein with respect to other embodiments may be used in the embodiments shown and described with reference to the above embodiments.

In one embodiment, at least part of the processing for example as shown by FIGS. 19-22 (a first region) also occurs in second region 70, with in one embodiment the proviso in second region 70 that tiers 22U be first insulating tiers and tiers 20U be second insulating tiers (at least in final construction) that are of different insulative compositions relative one another (e.g., 26 and 24, for example silicon dioxide and silicon nitride, respectively). Such is shown by way of example in FIGS. 43 and 44 with respect to a construction 10a. Like numerals from the above-described embodiments have been used where appropriate, with some construction differences being indicated with the suffix "a" or with different numerals.

Figure 43:
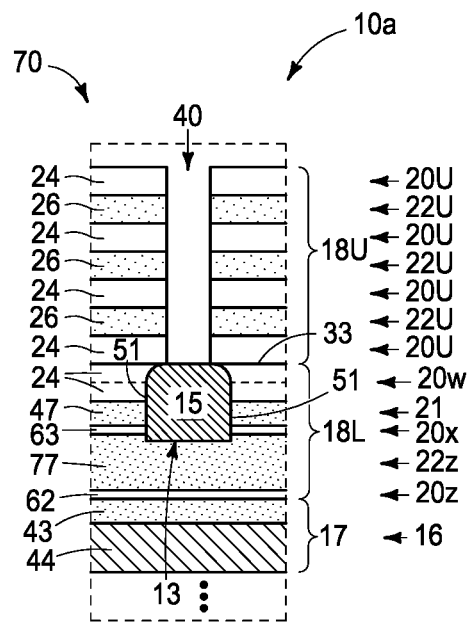
Figure 44:
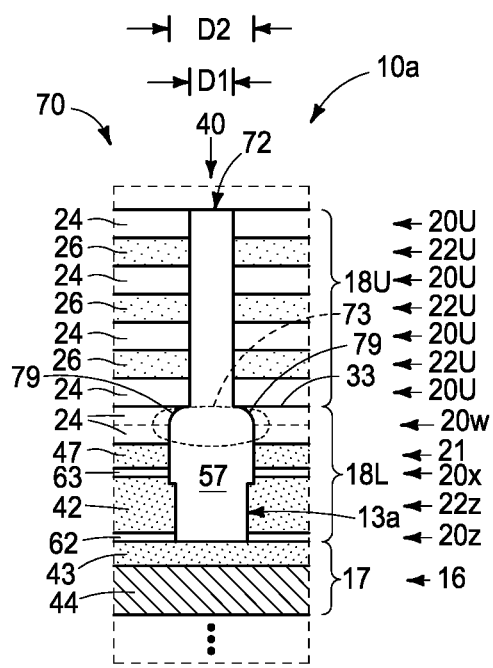

FIG. 43 shows a trench 40 as having been formed in second region 70, for example as may alternately occur with respect to the processing described above with respect to construction 10 in FIG. 23. FIG. 44 shows subsequent processing as may have correspondingly occurred together with the processing shown by FIGS. 24-35 with respect to construction 10, yet to result in construction 10a in FIG. 44 as opposed to construction 10 in FIG. 36. Thereby, in construction 10a and in one embodiment, a horizontal line 13a (e.g., comprising material 57) in second vertical stack 18* extends upwardly into upper portion 18U. In one such embodiment and as shown, horizontal line 18* in second vertical stack 18* comprises a vertical wall 72 in upper and lower portions 18U, 18L, respectively, with vertical wall 72 extending through at least a majority (all as shown) of first and second insulating tiers 22U, 20U in upper portion 18U. In one such embodiment, that portion of vertical wall 72 in upper portion 18U where joining with that portion of vertical wall 72 in lower portion 18L is narrower (e.g., D1) than an uppermost part 73 of that portion of vertical wall 72 in lower portion 18L (e.g., dimension D1 being narrower/smaller than dimension D2).

An embodiment of the invention includes a method used in forming a memory array (e.g., 12) comprising strings (e.g., 49) of memory cells (e.g., 56) comprising forming a lower portion (e.g., 18L) of a stack (e.g., 18*) that will comprise vertically-alternating different-composition first tiers (e.g., 22*) and second tiers (e.g., 20*). The stack comprises laterally-spaced memory-block regions (e.g., 58). The lower portion comprises horizontally-elongated lines (e.g., 13) that are individually between immediately-laterally-adjacent of the memory-block regions. Individual of the lines comprise sacrificial material (e.g., 15). The individual lines comprise laterally-opposing uppermost corner regions (e.g., 75) that are exposed above laterally-opposing sidewalls there-below (e.g., 51). The laterally-opposing sidewalls below the corner regions are covered by lower-portion material (e.g., 24/63/77/62 collectively comprising lower-portion material, only a portion of which covers sidewalls 51). The sacrificial material is removed from the exposed corner regions in a greater amount diagonally (e.g., vector D) than orthogonally relative to exposed sidewalls of the corner regions (e.g., vector H) and than orthogonally relative to exposed tops of the corner regions (e.g., vector V). After the removing of the sacrificial material from the exposed corner regions, the vertically-alternating different-composition first tiers and second tiers of an upper portion (e.g., 18U) of the stack are formed above the lower portion and the lines. Channel-material strings (e.g., 53) are formed and that extend through the first tiers and the second tiers in the upper portion to the lower portion. Horizontally-elongated trenches (e.g., 40) are formed through the upper portion and that are individually between the immediately-laterally-adjacent memory-block regions and that extend to the individual line there-between in the lower portion. The sacrificial material of the lines is removed through the trenches. Intervening material (e.g., 57) is formed in the trenches and void-spaces left as a result of the removing of the sacrificial material of the lines. Any other attribute(s) or aspect(s) as shown and/or described herein with respect to other embodiments may be used.

Alternate embodiment constructions may result from method embodiments described above, or otherwise. Regardless, embodiments of the invention encompass memory arrays independent of method of manufacture. Nevertheless, such memory arrays may have any of the attributes as described herein in method embodiments. Likewise, the above-described method embodiments may incorporate, form, and/or have any of the attributes described with respect to device embodiments.

In one embodiment, integrated circuitry comprises a memory array (e.g., 12) comprising strings (e.g., 53) of memory cells (e.g., 56). Such includes laterally-spaced memory blocks (e.g., 58) individually comprising a first vertical stack (e.g., 18* of FIG. 38) comprising alternating insulative tiers (e.g., 20*) and conductive tiers (e.g., 22*/21) above a conductor tier (e.g., 16). Strings (e.g., 49) of memory cells (e.g., 56) comprise channel-material strings (e.g., 53) that extend through the insulative tiers and the conductive tiers. The channel-material strings directly electrically couple with conductor material (e.g., 17) of the conductor tier. The conductive tiers individually comprising a horizontally-elongated conductive line (e.g., 29). A second vertical stack (e.g., 18* of second region 70) is aside the first vertical stack and comprises an upper portion (e.g., 18U) and a lower portion (e.g., 18L). The upper portion comprises vertically-alternating first insulating tiers (e.g., 22U being insulative in final construction in second region 70 in this embodiment) and second insulating tiers (e.g., 20U) that are of different insulative compositions relative one another. The lower portion comprises a horizontal line (e.g., 13, 13a) above the conductor tier that runs parallel with the laterally-spaced memory blocks in the first vertical stack.

In one embodiment, the horizontal line in the second vertical stack extends upwardly into the upper portion (e.g., 13a in FIG. 44). In one such embodiment, the horizontal line in the second vertical stack comprises a vertical wall (e.g., 72) in the upper and lower portions and the vertical wall extends through at least a majority of the first and second insulating tiers in the upper portion. In one embodiment, that portion of the vertical wall in the upper portion where joining with that portion of the vertical wall in the lower portion is narrower (e.g., D1) than an uppermost part (e.g., 73) of that portion of the vertical wall in the lower portion (e.g., dimension D1 being narrower/smaller than dimension D2). In one embodiment, the horizontal line in the second vertical stack does not extend upwardly into the upper portion (e.g., 13 in FIG. 42). In one such embodiment, the horizontal line in the second vertical stack has uppermost laterally-opposing uppermost corner regions (e.g., 75 in FIG. 42) in the lower portion that individually have a curved outermost surface (e.g., 79). In one embodiment, the horizontal line in the second vertical stack is insulative.

Any other attribute(s) or aspect(s) as shown and/or described herein with respect to other embodiments may be used.

In one embodiment, integrated circuitry comprises a memory array (e.g., 12) comprising strings (e.g., 53) of memory cells (e.g., 56). Such includes laterally-spaced memory blocks (e.g., 58) individually comprising a first vertical stack (e.g., 18* of FIG. 38) comprising alternating insulative tiers (e.g., 20*) and conductive tiers (e.g., 22*/21) above a conductor tier (e.g., 16). Strings (e.g., 49) of memory cells (e.g., 56) comprise channel-material strings (e.g., 53) that extend through the insulative tiers and the conductive tiers. The channel-material strings directly electrically couple with conductor material (e.g., 17) of the conductor tier. A second vertical stack (e.g., 18* of second region 70) is aside the first vertical stack and comprises an upper portion (e.g., 18U) and a lower portion (e.g., 18L). The upper portion comprises vertically-alternating first insulating tiers (e.g., 22U being insulative in final construction in second region 70 in this embodiment) and second insulating tiers (e.g., 20U) that are of different insulative compositions relative one another. The lower portion comprises a horizontal dummy conductive line (e.g., 13, 13a) that runs parallel with the laterally-spaced memory blocks in the first vertical stack. In one embodiment, the horizontal line in the second vertical stack has uppermost laterally-opposing uppermost corner regions (e.g., 75 in FIG. 42) in the lower portion that individually have a curved outermost surface (e.g., 79). Any other attribute(s) or aspect(s) as shown and/or described herein with respect to other embodiments may be used.

The above processing(s) or construction(s) may be considered as being relative to an array of components formed as or within a single stack or single deck of such components above or as part of an underlying base substrate (albeit, the single stack/deck may have multiple tiers). Control and/or other peripheral circuitry for operating or accessing such components within an array may also be formed anywhere as part of the finished construction, and in some embodiments may be under the array (e.g., CMOS under-array). Regardless, one or more additional such stack(s)/deck(s) may be provided or fabricated above and/or below that shown in the figures or described above. Further, the array(s) of components may be the same or different relative one another in different stacks/decks and different stacks/decks may be of the same thickness or of different thicknesses relative one another. Intervening structure may be provided between immediately-vertically-adjacent stacks/decks (e.g., additional circuitry and/or dielectric layers). Also, different stacks/decks may be electrically coupled relative one another. The multiple stacks/decks may be fabricated separately and sequentially (e.g., one atop another), or two or more stacks/decks may be fabricated at essentially the same time.

The assemblies and structures discussed above may be used in integrated circuits/circuitry and may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

In this document unless otherwise indicated, "elevational", "higher", "upper", "lower", "top", "atop", "bottom", "above", "below", "under", "beneath", "up", and "down" are generally with reference to the vertical direction. "Horizontal" refers to a general direction (i.e., within 10 degrees) along a primary substrate surface and may be relative to which the substrate is processed during fabrication, and vertical is a direction generally orthogonal thereto. Reference to "exactly horizontal" is the direction along the primary substrate surface (i.e., no degrees there-from) and may be relative to which the substrate is processed during fabrication. Further, "vertical" and "horizontal" as used herein are generally perpendicular directions relative one another and independent of orientation of the substrate in three-dimensional space. Additionally, "elevationally-extending" and "extend (ing) elevationally" refer to a direction that is angled away by at least 45° from exactly horizontal. Further, "extend (ing) elevationally", "elevationally-extending", "extend (ing) horizontally", "horizontally-extending" and the like with respect to a field effect transistor are with reference to orientation of the transistor's channel length along which current flows in operation between the source/drain regions. For bipolar junction transistors, "extend (ing) elevationally" "elevationally-extending", "extend (ing) horizontally", "horizontally-extending" and the like, are with reference to orientation of the base length along which current flows in operation between the emitter and collector.

In some embodiments, any component, feature, and/or region that extends elevationally extends vertically or within 10° of vertical.

Further, "directly above", "directly below", and "directly under" require at least some lateral overlap (i.e., horizontally) of two stated regions/materials/components relative one another. Also, use of "above" not preceded by "directly" only requires that some portion of the stated region/material/component that is above the other be elevationally outward of the other (i.e., independent of whether there is any lateral overlap of the two stated regions/materials/components). Analogously, use of "below" and "under" not preceded by "directly" only requires that some portion of the stated region/material/component that is below/under the other be elevationally inward of the other (i.e., independent of whether there is any lateral overlap of the two stated regions/materials/components).

Any of the materials, regions, and structures described herein may be homogenous or non-homogenous, and regardless may be continuous or discontinuous over any material which such overlie. Where one or more example composition(s) is/are provided for any material, that material may comprise, consist essentially of, or consist of such one or more composition(s). Further, unless otherwise stated, each material may be formed using any suitable existing or future-developed technique, with atomic layer deposition, chemical vapor deposition, physical vapor deposition, epitaxial growth, diffusion doping, and ion implanting being examples.

Additionally, "thickness" by itself (no preceding directional adjective) is defined as the mean straight-line distance through a given material or region perpendicularly from a closest surface of an immediately-adjacent material of different composition or of an immediately-adjacent region. Additionally, the various materials or regions described herein may be of substantially constant thickness or of variable thicknesses. If of variable thickness, thickness refers to average thickness unless otherwise indicated, and such material or region will have some minimum thickness and some maximum thickness due to the thickness being variable. As used herein, "different composition" only requires those portions of two stated materials or regions that may be directly against one another to be chemically and/or physically different, for example if such materials or regions are not homogenous. If the two stated materials or regions are not directly against one another, "different composition" only requires that those portions of the two stated materials or regions that are closest to one another be chemically and/or physically different if such materials or regions are not homogenous. In this document, a material, region, or structure is "directly against" another when there is at least some physical touching contact of the stated materials, regions, or structures relative one another. In contrast, "over", "on", "adjacent", "along", and "against" not preceded by "directly" encompass "directly against" as well as construction where intervening material(s), region (s), or structure(s) result(s) in no physical touching contact of the stated materials, regions, or structures relative one another.

Herein, regions-materials-components are "electrically coupled" relative one another if in normal operation electric current is capable of continuously flowing from one to the other and does so predominately by movement of subatomic positive and/or negative charges when such are sufficiently generated. Another electronic component may be between and electrically coupled to the regions-materials-components. In contrast, when regions-materials-components are referred to as being "directly electrically coupled", no intervening electronic component (e.g., no diode, transistor, resistor, transducer, switch, fuse, etc.) is between the directly electrically coupled regions-materials-components.

Any use of "row" and "column" in this document is for convenience in distinguishing one series or orientation of features from another series or orientation of features and along which components have been or may be formed. "Row" and "column" are used synonymously with respect to any series of regions, components, and/or features independent of function. Regardless, the rows may be straight and/or curved and/or parallel and/or not parallel relative one another, as may be the columns. Further, the rows and columns may intersect relative one another at 90° or at one or more other angles (i.e., other than the straight angle).

The composition of any of the conductive/conductor/conducting materials herein may be metal material and/or conductively-doped semiconductive/semiconductor/semiconducting material. "Metal material" is any one or combination of an elemental metal, any mixture or alloy of two or more elemental metals, and any one or more conductive metal compound(s).

Herein, any use of "selective" as to etch, etching, removing, removal, depositing, forming, and/or formation is such an act of one stated material relative to another stated material(s) so acted upon at a rate of at least 2:1 by volume. Further, any use of selectively depositing, selectively growing, or selectively forming is depositing, growing, or forming one material relative to another stated material or materials at a rate of at least 2:1 by volume for at least the first 75 Angstroms of depositing, growing, or forming.

Unless otherwise indicated, use of "or" herein encompasses either and both.

CONCLUSION

In some embodiments, a method used in forming a memory array comprising strings of memory cells comprises forming a lower portion of a stack that will comprise vertically-alternating different-composition first tiers and second tiers. The stack comprises laterally-spaced memory-block regions. The lower portion comprises horizontally-elongated lines that are individually between immediately-laterally-adjacent of the memory-block regions. Individual of the lines comprise sacrificial material. The individual lines comprise laterally-opposing uppermost corner that regions are exposed above laterally-opposing sidewalls there-below. The laterally-opposing sidewalls below the corner regions are covered by lower-portion material. The sacrificial material is removed from the exposed corner regions in a greater amount diagonally than orthogonally relative to exposed sidewalls of the corner regions and than orthogonally relative to exposed tops of the corner regions. After the removing of the sacrificial material from the exposed corner regions, the vertically-alternating different-composition first tiers and second tiers of an upper portion of the stack are formed above the lower portion and the lines. Channel-material strings are formed that extend through the first tiers and the second tiers in the upper portion to the lower portion. Horizontally-elongated trenches are formed through the upper portion and that are individually between the immediately-laterally-adjacent memory-block regions and that extend to the individual line there-between in the lower portion. The sacrificial material of the lines is removed through the trenches. Intervening material is formed in the trenches and void-spaces left as a result of the removing of the sacrificial material of the lines.

In some embodiments, a method used in forming a memory array comprising strings of memory cells comprises forming a conductor tier comprising conductor material on a substrate. A lower portion of a stack is formed that will comprise vertically-alternating different-composition first tiers and second tiers above the conductor tier. The stack comprises laterally-spaced memory-block regions. The lower portion comprises horizontally-elongated lines that are individually between immediately-laterally-adjacent of the memory-block regions. Individual of the lines comprise sacrificial material. The individual lines comprise laterally-opposing uppermost corner regions that t are exposed above laterally-opposing sidewalls there-below. The laterally-opposing sidewalls below the corner regions are covered by the lower-portion material. The sacrificial material is removed from the exposed corner regions in a greater amount diagonally than orthogonally relative to exposed sidewalls of the corner regions and than orthogonally relative to exposed tops of the corner regions. After the removing of the sacrificial material from the exposed corner regions, the vertically-alternating different-composition first tiers and second tiers of an upper portion of the stack are formed above the lower portion and the lines. Channel-material strings are formed that extend through the first tiers and the second tiers in the upper portion to the lower portion. Horizontally-elongated trenches are formed through the upper portion and that are individually between the immediately-laterally-adjacent memory-block regions and that extend to the individual line there-between in the lower portion. Individual of the trenches where joining with its individual line there-below are narrower than an uppermost surface of its individual line there-below at least prior to the removing of the sacrificial material from the exposed corner regions. The sacrificial material of the lines is removed through the trenches. Through the trenches and through void-spaces left as a result of the removing of the sacrificial material of the lines, conductive material is formed in the lower portion that directly electrically couples together the channel material of individual of the channel-material strings and the conductor material of the conductor tier. Intervening material is formed in the trenches and the void-spaces after forming the conductive material.

In some embodiments, integrated circuitry comprising a memory array comprises strings of memory cells comprising laterally-spaced memory blocks individually comprising a first vertical stack comprising alternating insulative tiers and conductive tiers above a conductor tier. Strings of memory cells comprise channel-material strings that extend through the insulative tiers and the conductive tiers. The channel-material strings directly electrically couple with conductor material of the conductor tier. The conductive tiers individually comprise a horizontally-elongated conductive line. A second vertical stack is aside the first vertical stack. The second vertical stack comprises an upper portion and a lower portion. The upper portion comprises vertically-alternating first insulating tiers and second insulating tiers that are of different insulative compositions relative one another. The lower portion comprises a horizontal line above the conductor tier that runs parallel with the laterally-spaced memory blocks in the first vertical stack.

In some embodiments, integrated circuitry comprising a memory array comprises strings of memory cells comprising laterally-spaced memory blocks individually comprising a first vertical stack comprising alternating insulative tiers and conductive tiers. Strings of memory cells comprise channel-material strings that extend through the insulative tiers and the conductive tiers. The conductive tiers individually comprise a horizontally-elongated conductive line. A second vertical stack is aside the first vertical stack. The second vertical stack comprises an upper portion and a lower portion. The upper portion comprises vertically-alternating first insulating tiers and second insulating tiers that are of different insulative compositions relative one another. The lower portion comprises a horizontal dummy conductive line that runs parallel with the laterally-spaced memory blocks in the first vertical stack.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. A method used in forming a memory array comprising strings of memory cells, comprising:
   forming a lower portion of a stack that will comprise vertically-alternating different-composition first tiers and second tiers, the stack comprising laterally-spaced memory-block regions, the lower portion comprising horizontally-elongated lines that are individually between immediately-laterally-adjacent of the memory-block regions, individual of the lines comprising sacrificial material, the individual lines comprising laterally-opposing uppermost corner regions that are exposed above laterally-opposing sidewalls there-below, the laterally-opposing sidewalls below the corner regions being covered by lower-portion material;
   removing the sacrificial material from the exposed corner regions in a greater amount diagonally in a vertical plane than orthogonally relative to exposed sidewalls of the corner regions and than orthogonally relative to exposed tops of the corner regions;
   after the removing of the sacrificial material from the exposed corner regions, forming the vertically-alternating different-composition first tiers and second tiers of an upper portion of the stack above the lower portion and the lines, and forming channel-material strings that extend through the first tiers and the second tiers in the upper portion to the lower portion;
   forming horizontally-elongated trenches through the upper portion and that are individually between the immediately-laterally-adjacent memory-block regions and that extend to the individual line there-between in the lower portion;
   removing the sacrificial material of the lines through the trenches; and
   forming intervening material in the trenches and voidspaces left as a result of the removing of the sacrificial material of the lines.

2. The method of claim 1 wherein the removing of the sacrificial material from the exposed corner regions comprises etching.

3. The method of claim 2 wherein the etching is isotropic.

4. The method of claim 1 wherein the lower portion at least as initially formed comprises multiple of the first tiers and multiple of the second tiers.

5. The method of claim 1 wherein individual of the trenches where joining with its individual line there-below are narrower than an uppermost surface of its individual line there-below at least prior to the removing of the sacrificial material from the exposed corner regions.

6. The method of claim 1 wherein:
   prior to the removing of the sacrificial material from the exposed corner regions, the lines and the lower-portion material comprise respective uppermost surfaces that are individually planar and are collectively co-planar; and
   prior to the removing of the sacrificial material from the exposed corner regions, the exposed corner regions are so exposed by removing the lower-portion material to have its uppermost surfaces be lower than the uppermost surfaces of the lines.

7. The method of claim 6 wherein the removing the lower-portion material to have its uppermost surfaces be lower than the uppermost surfaces of the lines comprises etching.

8. The method of claim 6 sequentially comprising:
   after the removing of the sacrificial material from the exposed corner regions, forming more material over the uppermost surfaces of the lines and aside the lines to a greater thickness than thickness of the lower-portion material that was removed to have its uppermost surfaces be higher than the uppermost surfaces of the lines; and
   planarizing the more material back at least to the uppermost surfaces of the lines such that the lines and the more material comprise respective uppermost surfaces that are individually planar and are collectively co-planar.

9. The method of claim 1 wherein,
   the stack comprises a first vertical stack that is formed above a conductor tier comprising conductor material; and
   the stack comprises a second vertical stack aside the first vertical stack, the second vertical stack being above the conductor tier and comprising an upper portion and a lower portion, the upper portion of the second vertical stack comprising vertically-alternating first insulating tiers and second insulating tiers that are of different insulative compositions relative one another, the lower portion in the second vertical stack comprising a horizontal line above the conductor tier that runs parallel with the laterally-spaced memory blocks in the first vertical stack.

10. The method of claim 9 wherein the horizontal line in the second vertical stack extends upwardly into the upper portion.

11. The method of claim 10 wherein the horizontal line in the second vertical stack comprises a vertical wall in the upper and lower portions, the vertical wall extending through at least a majority of the first and second insulating tiers in the upper portion.

12. The method of claim 11 wherein that portion of the vertical wall in the upper portion where joining with that portion of the vertical wall in the lower portion being narrower than an uppermost part of that portion of the vertical wall in the lower portion.

13. The method of claim 9 wherein the horizontal line in the second vertical stack does not extend upwardly into the upper portion.

14. The method of claim 13 wherein the horizontal line in the second vertical stack has uppermost laterally-opposing uppermost corner regions in the lower portion that individually have a curved outermost surface.

15. The method of claim 9 wherein the horizontal line in the second vertical stack is conductive and dummy.

16. The method of claim 9 wherein the horizontal line in the second vertical stack is insulative.

17. The method of claim 1 wherein, the stack comprises a first vertical stack; and the stack comprises a second vertical stack aside the first vertical stack, the second vertical stack an upper portion and a lower portion, the upper portion of the second vertical stack comprising vertically-alternating first insulating tiers and second insulating tiers that are of different insulative compositions relative one another, the lower portion in the second vertical stack comprising a horizontal dummy conductive line that runs parallel with the laterally-spaced memory blocks in the first vertical stack.

18. The method of claim 17 wherein the horizontal line in the second vertical stack has uppermost laterally-opposing uppermost corner regions in the lower portion that individually have a curved outermost surface.

19. A method used in forming a memory array comprising strings of memory cells, comprising:

forming a conductor tier comprising conductor material on a substrate;

stack that will comprise forming a lower portion of a vertically-alternating different-composition first tiers and second tiers above the conductor tier, the stack comprising laterally-spaced memory-block regions, the lower portion comprising horizontally-elongated lines that are individually between immediately-laterally-adjacent of the memory-block regions, individual of the lines comprising sacrificial material, the individual lines comprising laterally-opposing uppermost corner regions that are exposed above laterally-opposing sidewalls there-below, the laterally-opposing sidewalls below the corner regions being covered by a lower-portion material;

removing the sacrificial material from the exposed corner regions in a greater amount diagonally in a vertical plane than orthogonally relative to exposed sidewalls of the corner regions and than orthogonally relative to exposed tops of the corner regions;

after the removing of the sacrificial material from the exposed corner regions, forming the vertically-alternating different-composition first tiers and second tiers of an upper portion of the stack above the lower portion and the lines, and forming channel-material strings that extend through the first tiers and the second tiers in the upper portion to the lower portion;

forming horizontally-elongated trenches through the upper portion and that are individually between the immediately-laterally-adjacent memory-block regions and that extend to the individual line there-between in the lower portion, individual of the trenches where joining with its individual line there-below being narrower than an uppermost surface of its individual line there-below at least prior to the removing of the sacrificial material from the exposed corner regions;

removing the sacrificial material of the lines through the trenches;

through the trenches and through void-spaces left as a result of the removing of the sacrificial material of the lines, forming conductive material in the lower portion that directly electrically couples together the channel material of individual of the channel-material strings and the conductor material of the conductor tier; and forming intervening material in the trenches and the void-spaces after forming the conductive material.

20. The method of claim 19 wherein the lower portion at least as initially formed comprises a lower second tier below a lower first tier, the conductive material being formed in the lower first tier directly against sidewalls of the channel-material and directly against a top of the conductor material of the conductor tier.

21. The method of claim 19 wherein the lower portion at least as initially formed comprises multiple of the first tiers and multiple of the second tiers.

22. The method of claim 19 wherein the removing of the sacrificial material from the exposed corner regions comprises etching.

23. The method of claim 19 wherein:

prior to the removing of the sacrificial material from the exposed corner regions, the lines and the lower-portion material comprise respective uppermost surfaces that are individually planar and are collectively co-planar; and prior to the removing of the sacrificial material from the exposed corner regions, the exposed corner regions are so exposed by removing the lower-portion material to have its uppermost surfaces be lower than the uppermost surfaces of the lines.

24. The method of claim 23 wherein the removing the lower-portion material to have its uppermost surfaces be lower than the uppermost surfaces of the lines comprises etching.

25. The method of claim 23 sequentially comprising:

after the removing of the sacrificial material from the exposed corner regions, forming more material over the uppermost surfaces of the lines and aside the lines to a greater thickness than thickness of the lower-portion material that was removed to have its uppermost surfaces be higher than the uppermost surfaces of the lines; and planarizing the more material back at least to the uppermost surfaces of the lines such that the lines and the more material comprise respective uppermost surfaces that are individually planar and are collectively co-planar.

* * * * *